United States Patent
Cheng et al.

(10) Patent No.: US 11,145,653 B2
(45) Date of Patent: Oct. 12, 2021

(54) MULTI-THRESHOLD GATE STRUCTURE WITH DOPED GATE DIELECTRIC LAYER

(71) Applicant: Taiwan Semiconductor Manufacturing Co., Ltd., Hsinchu (TW)

(72) Inventors: Chung-Liang Cheng, Changhua County (TW); I-Ming Chang, ShinChu (TW); Ziwei Fang, Hsinchu (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/585,267

(22) Filed: Sep. 27, 2019

(65) Prior Publication Data

US 2021/0098457 A1    Apr. 1, 2021

(51) Int. Cl.
  *H01L 27/092* (2006.01)
  *H01L 21/8238* (2006.01)
  *H01L 29/78* (2006.01)
  *H01L 21/02* (2006.01)
  *H01L 29/66* (2006.01)

(52) U.S. Cl.
  CPC .... *H01L 27/0924* (2013.01); *H01L 21/02181* (2013.01); *H01L 21/02192* (2013.01); *H01L 21/823821* (2013.01); *H01L 29/66795* (2013.01); *H01L 29/785* (2013.01)

(58) Field of Classification Search
  CPC ......... H01L 27/0924; H01L 21/823821; H01L 29/785; H01L 21/02181; H01L 21/02192; H01L 29/66795
  See application file for complete search history.

(56) References Cited

U.S. PATENT DOCUMENTS 10,276,692 B1 * 4/2019 Chou .................. H01L 27/1211

* cited by examiner

*Primary Examiner* — Stephen W Smoot
*Assistant Examiner* — Vicki B. Booker
(74) *Attorney, Agent, or Firm* — Sterne, Kessler, Goldstein & Fox P.L.L.C.

(57) ABSTRACT

The present disclosure describes a semiconductor device that includes a semiconductor device that includes a first transistor having a first gate structure. The first gate structure includes a first gate dielectric layer doped with a first dopant at a first dopant concentration and a first work function layer on the first gate dielectric layer. The first gate structure also includes a first gate electrode on the first work function layer. The semiconductor device also includes a second transistor having a second gate structure, where the second gate structure includes a second gate dielectric layer doped with a second dopant at a second dopant concentration lower than the first dopant concentration. The second gate structure also includes a second work function layer on the second gate dielectric layer and a second gate electrode on the second work function layer.

20 Claims, 32 Drawing Sheets

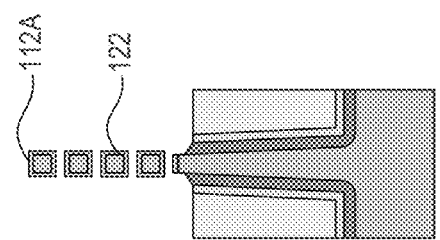
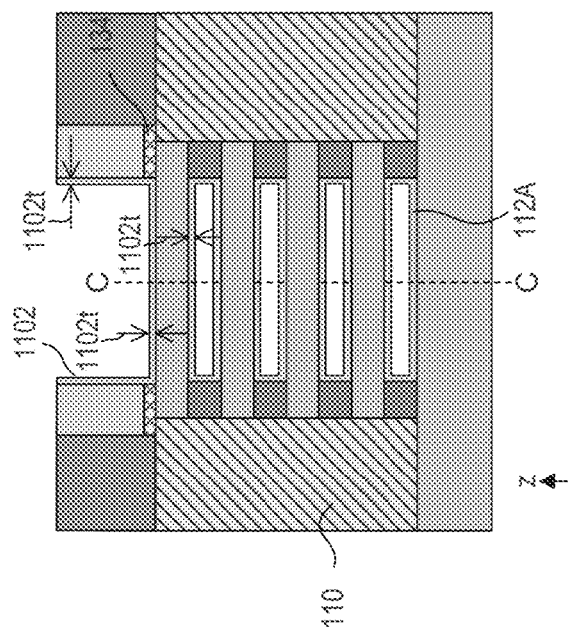
FIG. 10C
FIG. 10B

MULTI-THRESHOLD GATE STRUCTURE WITH DOPED GATE DIELECTRIC LAYER

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased power consumption and parasitic capacitance in semiconductor devices.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 10A-11J illustrate various cross-sectional views of semiconductor devices with doped gate dielectric layers and multiple work function layers at various stages of their fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
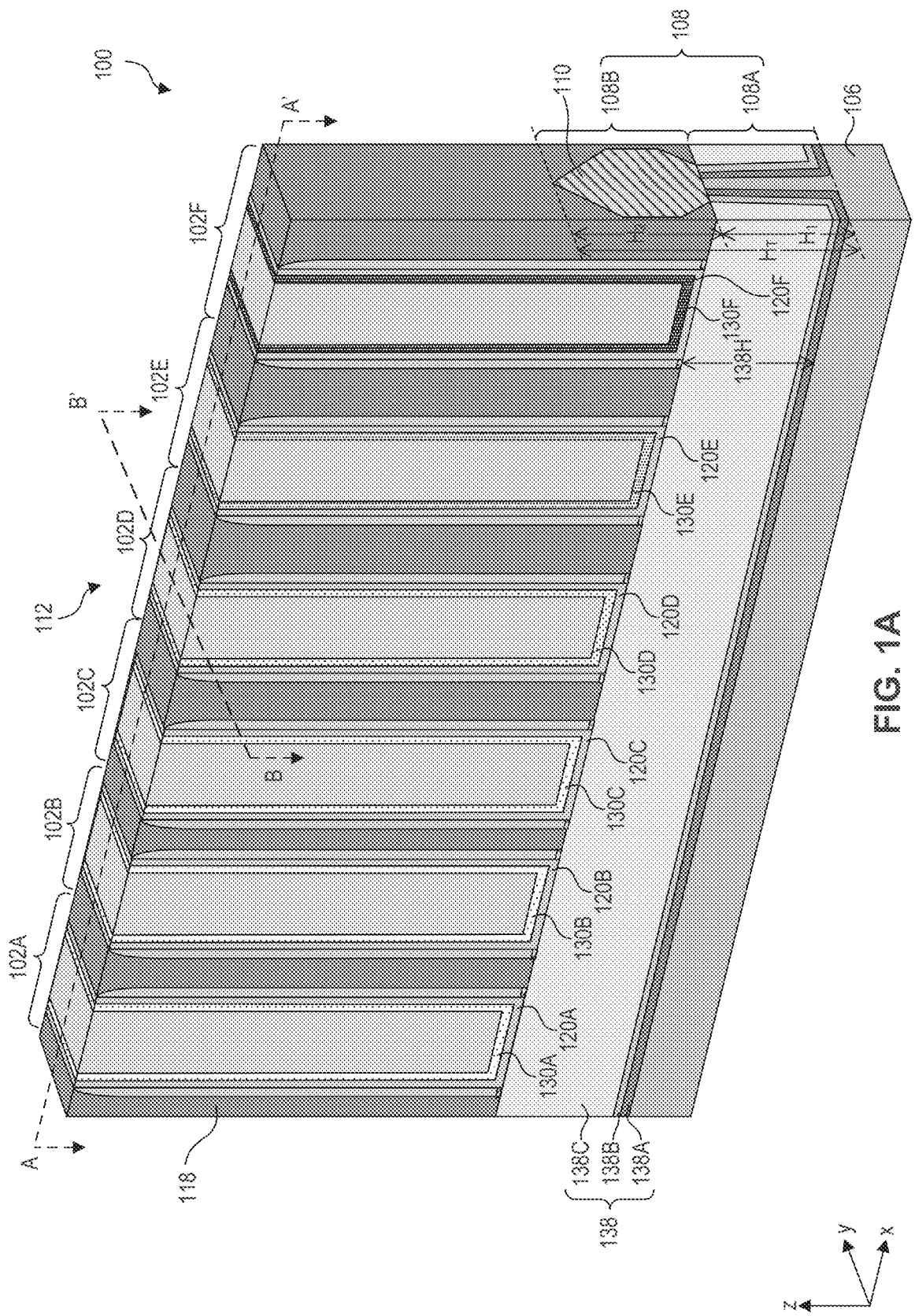
FIGS. 1A and 1B-1D illustrate an isometric view and cross-sectional views of semiconductor devices, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

As used herein, the term "high-k" refers to a high dielectric constant. In the field of semiconductor device structures and manufacturing processes, high-k refers to a dielectric constant that is greater than the dielectric constant of SiO2 (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

In some embodiments, the terms "about" and "substantially" can indicate a value of a given quantity that varies within 5% of the value (e.g., ±1%, ±2%, ±3%, ±4%, ±5% of the value).

The present disclosure provides example multi-threshold voltage field effective transistor (FET) devices (e.g., gate-all-around (GAA) FETs, fin-type FET (finFETs), horizontal or vertical GAA finFETs, or planar FETs) in a semiconductor device and/or in an integrated circuit (IC) and example methods for fabricating the same.

Multi-threshold voltage integrated circuit (IC) devices can be utilized in the semiconductor IC industry to optimize delay or power. A multi-threshold voltage IC device can include several different devices, each having a different threshold voltage (e.g., operating voltage). For example, a multi-threshold voltage IC device can include one or more low threshold voltage devices and one or more high threshold voltage devices. Approaches to achieving different threshold voltages across the semiconductor devices include work function layer thickness variation and ion implantation modulation. However, as technology nodes continue to decrease, functional density (e.g., the number of interconnected devices per chip area) has generally increased while geometry size (e.g., the smallest component (or line) that can be created using a fabrication process) has decreased. In a gate-all-around FET (GAA FET) for example, increasing work function layer thicknesses to accommodate different threshold voltages consumes valuable IC device space, limiting the amount of devices that can be fabricated on a single chip. On the other hand, varying ion implantation in a GAA FET to achieve different threshold voltages is also challenging and can result in non-conformity due to, for example, ion implantation shadow effects.

Various embodiments in the present disclosure describe methods for forming multi-threshold voltage devices. The embodiments described herein use GAA FETs as examples, and can be applied to other semiconductor structures, such as finFETs and planar FETs. Various embodiments herein describe multi-deposition and patterning process to form doped gate dielectric layers with different dopant concentrations and multi-layer metal work function materials as work function layers. For example, a plurality of devices having different compositions of doped gate dielectric layers and work function layers can be formed on a substrate to form semiconductor devices with multi-threshold voltages. The doped gate dielectric layers can be hafnium-based high-k (e.g., dielectric constant greater than about 3.9) dielectric layers doped with a suitable material, such as lanthanum or magnesium. Variations of the dopant concentrations can lead to changes in the crystallographic structure of the hafnium-based gate dielectric layers and form electric dipoles at the interfaces between the gate dielectric layers and work function layers, which can impact spontaneous polarization and internal bias fields and result in variations of device threshold voltage. The gate dielectric layers can be doped by depositing an intrinsic gate dielectric layer and depositing one or more dopant-containing dielectric films on the intrinsic gate dielectric layer. In some embodiments, an anneal process can be used to drive in the dopant from the dopant-containing films into the intrinsic gate dielectric layer.

Figure 1B:
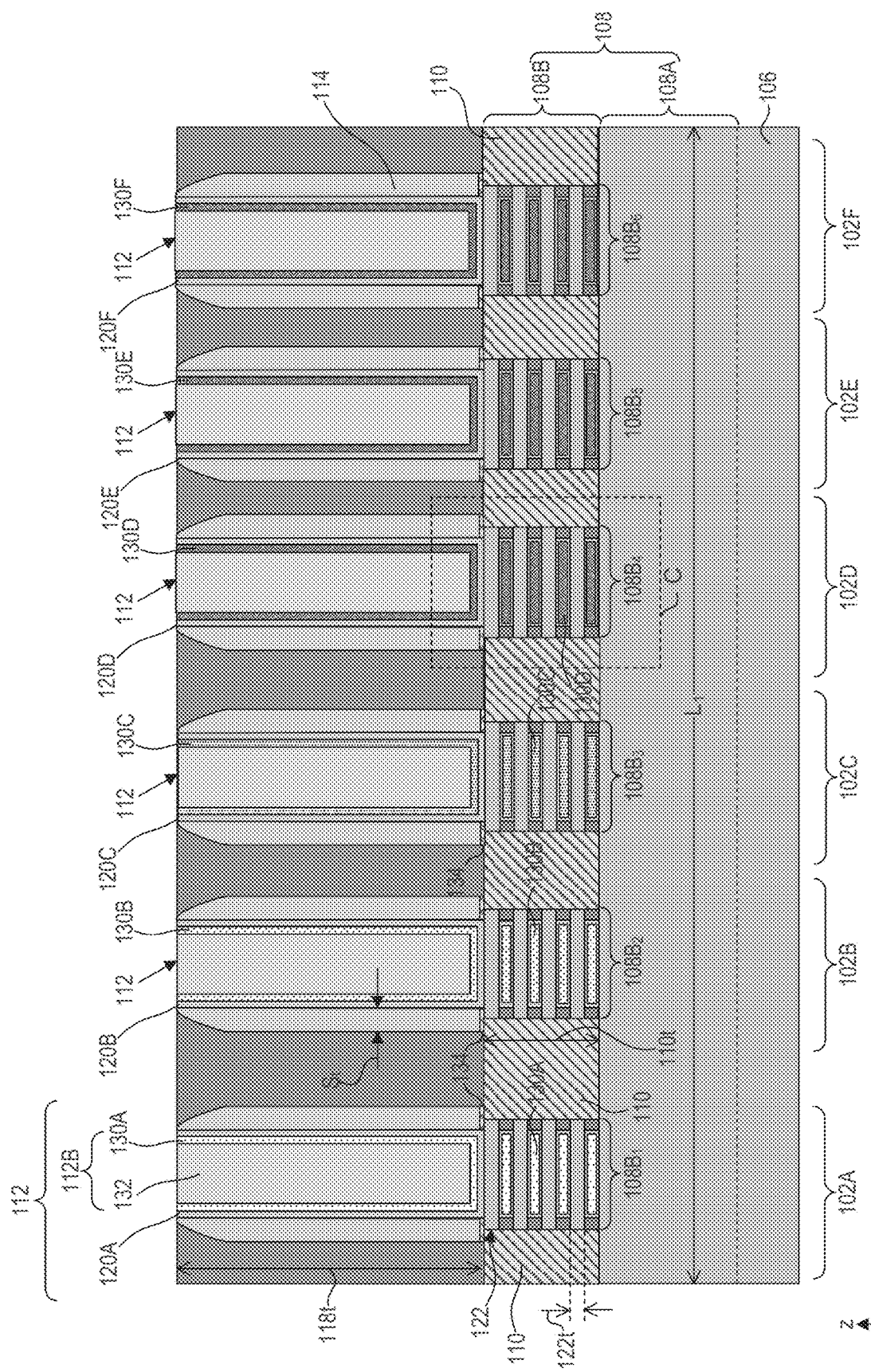
Figure 1C:
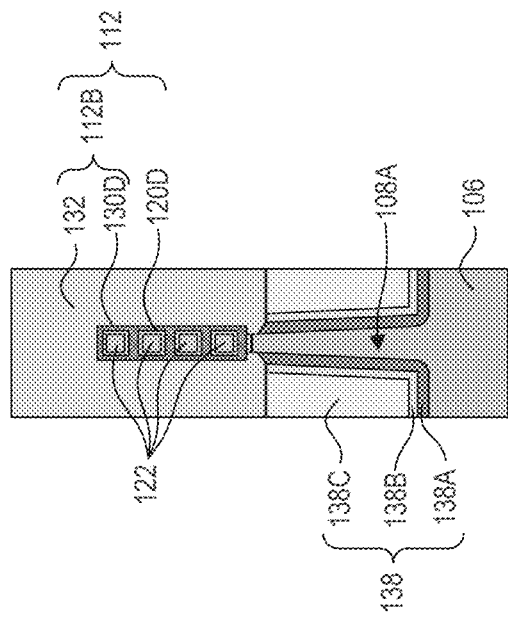
Figure 1D:
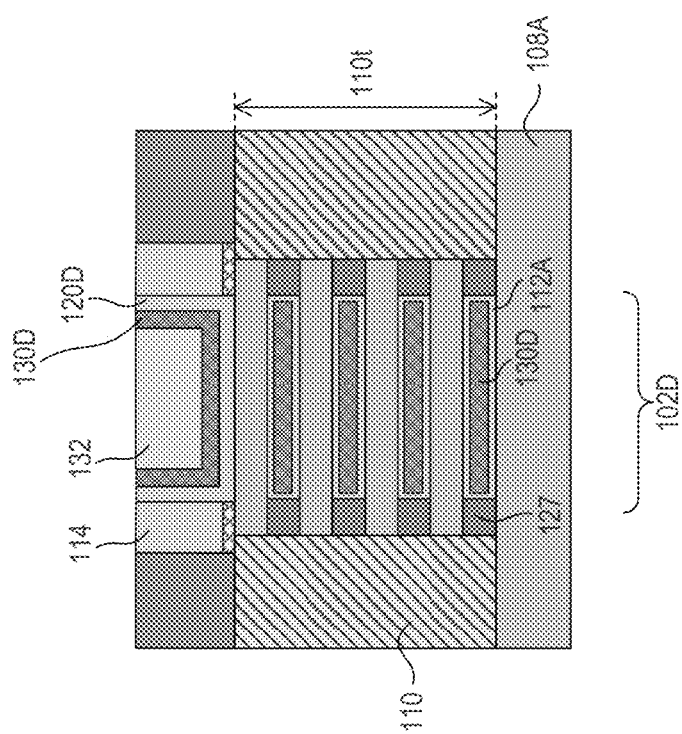

A semiconductor device 100 having finFETs 102A-102F is described with reference to FIGS. 1A-1D, according to some embodiments. FIG. 1A illustrates an isometric view of semiconductor device 100, according to some embodiments. FIG. 1B illustrates a cross-sectional view along line A-A' of semiconductor device 100 of FIG. 1A. FIG. 1C illustrates a zoomed-in area C of the cross-sectional view of FIG. 1B. FIG. 1D illustrates a cross-sectional view along line B-B' of semiconductor device 100 in FIG. 1A.

In some embodiments, finFETs 102A-102F can be both p-type finFETs (PFETs) or n-type finFETs (NFETs) or one of each conductivity type finFETs. For example, finFETs 102A-102C can be NFETs and finFETs 102D-102F can be PFETs. In some embodiments, finFETs 102A-102F can be can have different threshold voltages by incorporating different doped gate dielectric layers and work function layers. In some embodiments, finFETs 102A and 102F can be a ultra-low threshold voltage (uLVT) devices, finFETs 102B and 102E can be low threshold voltage (LVT) devices, and finFETs 102C and 102D can be standard threshold voltage (SVT) devices. In some embodiments, an ultra-low threshold voltage can be a threshold voltage between about 0.08 V and about 0.18 V. In some embodiments, a low threshold voltage can be a threshold voltage between about 0.15 V and about 0.25 V. In some embodiments, a standard threshold voltage can be a threshold voltage between about 0.21 V and about 0.31 V. In some embodiments, the voltage difference between ultra-low and low threshold voltage devices can be between about 50 mV and about 70 mV. In some embodiments, the voltage difference between low and standard threshold voltage devices can be between about 50 mV and about 70 mV. Although six finFETs are shown in FIGS. 1A-1B, semiconductor device 100 can have any number of finFETs. The discussion of elements of finFETs 102A-102F with the same annotations applies to each other, unless mentioned otherwise. The isometric and cross-sectional views of semiconductor device 100 are shown for illustration purposes and may not be drawn to scale.

Referring to FIGS. 1A-1B, finFETs 102A-102F can be formed on a substrate 106. Substrate 106 can be a semiconductor material, such as silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Semiconductor device 100 can further include a fin structure 108 extending along an x axis and through finFETs 102A-102F. Fin structure 108 can include a fin base portion 108A and a fin top portion 108B disposed on fin base portion 108A. In some embodiments, fin base portion 108A can include material similar to substrate 106. Fin base portion 108A can be formed from a photolithographic patterning and an etching of substrate 106. In some embodiments, fin top portion 108B can include stacked fin portions $108B_1$-$108B_6$ and epitaxial regions 110. Each of stacked fin portions $108B_1$-$108B_6$ can include a stack of semiconductor layers 122, which can be in the form of nanowires. Each semiconductor layer 122 can form a channel region underlying gate structures 112 of finFETs 102A-102F.

In some embodiments, semiconductor layers 122 can include semiconductor materials similar to or different from substrate 106. In some embodiments, each of semiconductor layer 122 can include silicon germanium (SiGe) with Ge in a range from about 25 atomic percent to about 50 atomic percent with any remaining atomic percent being Si or can include Si without any substantial amount of Ge.

The semiconductor materials of semiconductor layers 122 can be undoped or can be in-situ doped during their epitaxial growth process using: (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used. Semiconductor layers 122 can have respective vertical dimensions $122t$ (e.g., thicknesses) along a z-axis, each ranging from about 6 nm to about 10 nm. Other dimensions and materials for semiconductor layers 122 are within the scope and spirit of this disclosure.

Though four layers of semiconductor layers 122 are shown in FIGS. 1A-1B, semiconductor device 100 can have any number of semiconductor layers 122.

Referring to FIGS. 1A-1B, epitaxial fin regions 110 can be grown on regions of base fin portion 108A that do not underlie gate structures 112. In some embodiments, epitaxial fin regions 110 can have any geometric shape, for example, polygonal or circular. Epitaxial fin regions 110 can include an epitaxially-grown semiconductor material. In some embodiments, the epitaxially grown semiconductor material is the same material as the material of substrate 106. In some embodiments, the epitaxially-grown semiconductor mateial includes a different material from the material of substrate 106. The epitaxially-grown semiconductor material can include: (i) a semiconductor material, such as germanium or silicon; (ii) a compound semiconductor material, such as gallium arsenide and/or aluminum gallium arsenide; or (iii) a semiconductor alloy, such as silicon germanium and/or gallium arsenide phosphide.

Referring to FIG. 1C, in some embodiments, epitaxial fin regions 110 can each have a height 110t. In some embodiments, epitaxial fin height 110t can be equal to or different from vertical dimension $H_2$ of fin top portion 108B. In some embodiments, epitaxial fin height 110t can range from about 10 nm to about 100 nm. Other dimensions for epitaxial fin regions 110 are within the scope and spirit of this disclosure.

In some embodiments, epitaxial fin regions 110 can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110 can be grown by an epitaxial deposition/partial etch process, which repeats the epitaxial deposition/partial etch process at least once. Such repeated deposition/partial etch process is also called a cyclic deposition-etch (CDE) process.

Epitaxial fin regions 110 can be n-type for NFETs 102A-102C and p-type for PFETs 102D-102F. In some embodiments, epitaxial fin regions 110 of finFETs 102A-102F can be the same or opposite doping type with respect to each other. P-type epitaxial fin regions 110 can include SiGe and can be in-situ doped during an epitaxial growth process using p-type dopants, such as boron, indium, or gallium. For p-type in-situ doping, p-type doping precursors, such as diborane ($B_2H_6$), boron trifluoride ($BF_3$), and/or other p-type doping precursors, can be used. In some embodiments, n-type epitaxial fin regions 110 can include Si and may be in-situ doped during an epitaxial growth process using n-type dopants, such as phosphorus or arsenic. For n-type in-situ doping, n-type doping precursors, such as phosphine ($PH_3$), arsine ($AsH_3$), and/or other n-type doping precursors, can be used.

Referring to FIG. 1B, epitaxial fin regions 110 can form source/drain (S/D) regions of finFETs 102A-102F. Each of the channel regions in semiconductor layers 122 of stacked fin portions $108B_1$ through $108B_6$ can be interposed between a pair of S/D regions. Though finFETs 102A-102F are shown to have fin structure 108 with stacked fin portions $108B_1$ through $108B_6$ on fin base portion 108A, other fin structures (e.g., a single layered fin structure etched from or epitaxially grown on substrate 106) of finFETs 102A through 102F are within the scope and spirit of this disclosure.

In some embodiments, fin base portion 108A and fin top portion 108B can have respective vertical dimensions $H_1$ and $H_2$ (e.g., heights) along a z-axis, each ranging from about 40 nm to about 60 nm. Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm. In some embodiments, fin structure 108 can have a horizontal dimension $L_1$ (e.g., length) along an x-axis ranging from about 100 nm to about 1 μm. Horizontal dimension $L_1$ of fin structure 108 can be at least 100 nm to prevent the relaxation of strain in fin structure 108, and consequently, prevent the relaxation of strain in channel regions formed in semiconductor layers 122 under gate structures 112. Other dimensions and materials for fin structure 108 are within the scope and spirit of this disclosure.

In some embodiments, finFETs 102A-102F can further include gate structures 112 and spacers 114. Referring to FIGS. 1A-1D, gate structures 112 can be multi-layered structures and can be wrapped around stacked fin portions $108B_1$ through $108B_6$. In some embodiments, each of semiconductor layers 122 of stacked fin portions $108B_1$ through $108B_6$ can be wrapped around by one of gate structures 112 or one or more layers of one of gate structures 112 for which gate structures 112 can be also referred to as "gate-all-around (GAA) structures" or "horizontal gate-all-around structures" and finFETs 102A-102F can be also referred to as "GAA FETs" or "GAA finFETs."

Each gate structure 112 can include a gate dielectric layer disposed on semiconductor layers 122 and work function layers 130 disposed on the gate dielectric layer. For example, NFET 102A includes work function layer 130A formed on a gate dielectric layer 120A. In some embodiments, each gate dielectric layer 120A-120F can include doped gate dielectric layers. For example, gate dielectric layer 120A can be a hafnium-based high-k (e.g., dielectric constant greater than about 3.9) dielectric layer doped with a nominal level of lanthanum. In some embodiments, each work function layer 130A-130F can include one or more work function layers. For example, work function layer 130A can include one or more n-type work function layers and one or more p-type work function layers. For simplicity, each work function layer and metal fill layer can be collectively referred to as gate electrode 112B.

To prevent shorting between gate structures 112 and S/D regions during operation of finFETs 102A-102F, each gate dielectric layer 120A-120F can be wrapped around each semiconductor layer 122. Using PFET 102D as an example, gate dielectric layer 120D can be wrapped around each semiconductor layer 122 as shown in FIG. 1D, and thus electrically isolate semiconductor layers 122 from each other and from conductive gate electrode 112B. In some embodiments, gate dielectric layer 120A-120F can include (i) a layer of silicon oxide, silicon nitride, and/or silicon oxynitride formed by CVD, atomic layer deposition (ALD), physical vapor deposition (PVD), e-beam evaporation, or other suitable processes, (ii) a high-k dielectric material, such as $HfO_2$, titanium oxide ($TiO_2$), tantalum oxide ($Ta_2O_3$), $HfSiO_4$, zirconium oxide ($ZrO_2$), and zirconium silicate ($ZrSiO_2$), (iii) a high-k dielectric material having oxides of lithium (Li), beryllium (Be), magnesium (Mg), Ca, Sr, Sc, Y, Zr, Al, La, Ce, praseodymium (Pr), neodymium (Nd), samarium (Sm), europium (Eu), Gd, terbium (Tb), Dy, holmium (Ho), Er, thulium (Tm), ytterbium (Yb), or lutetium (Lu), or (iv) a combination thereof. High-k dielectric layers can be formed by ALD and/or other suitable methods.

FIG. 1D illustrates a cross-sectional view of PFET 102D as viewed from the B-B' cross-sectional surface. In some embodiments, PFET 102D can be a standard threshold voltage p-type FET. PFET 102D can include a gate electrode 112B that includes a gate dielectric layer 120D, a gate work function layer 130D, and a gate metal fill layer 132. PFET 102D can further include a gate barrier layer and a gate interface layer which are not shown in FIG. 1D for simplicity. As shown in FIG. 1D, each of semiconductor layers 122 can be wrapped around by gate barrier layers and gate work function layers 130D. Depending on the spaces between adjacent semiconductor layers 122 and the thicknesses of the layers included in gate structures 112, semiconductor layers 122 can be wrapped around by one or more layers of gate electrodes 112B filling the spaces between adjacent semiconductor layers 122. Although FIG. 1D shows gate metal fill layers 132 partially wrapped around semiconductor layers 122, gate metal fill layers 132 can also wrap around semiconductor layers 122 to fill the spaces between adjacent semiconductor layers 122 (not shown), according to some embodiments.

Each gate dielectric layer 120A-120F can include high-k gate dielectric layer with various dopant levels. In some embodiments, the high-k dielectric gate layer can be a hafnium-based dielectric layer, such as hafnium dioxide. In some embodiments, gate dielectric layers 120A-120F can be in a crystalline state. In some embodiments, gate dielectric layers 120A-120F can exhibit suitable electrical properties, such as ferroelectric properties. In some embodiments, gate dielectric layers 120A-120F can be doped by suitable material, such as lanthanum, magnesium, silicon, yttrium, gadolinium, strontium, any suitable material, and/or combinations thereof.

Each gate work function layer 130A-130F can include a single work function layer or a stack of work function layers. Multi-threshold voltages can be achieved by configuring work function layers of finFETs 102A-102F such that threshold voltages can be different between devices. In some embodiments, the stack of work function layers can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, each gate work function layer 130A-130F can include Al-doped metal, such as Al-doped Ti, Al-doped TiN, Al-doped Ta, or Al-doped TaN. Gate work function layers 130A-130F can be formed using a suitable process, such as ALD, CVD, PVD, plating, or combinations thereof. In some embodiments, each gate work function layer 130A-130F can have a thickness ranging from about 2 nm to about 15 nm. Other materials, formation methods and thicknesses for gate work function layers 130A-130F are within the scope and spirit of this disclosure.

Each gate metal fill layer 132 can be a gate electrode that includes a single metal layer or a stack of metal layers. The stack of metal layers can include metals different from each other. In some embodiments, each gate metal fill layer 132 can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Gate metal fill layers 132 can be formed by ALD, PVD, CVD, or other suitable deposition processes. Other materials and formation methods for gate metal fill layers 132 are within the scope and spirit of this disclosure. Though gate structures 112 of finFETs 102A-102F are shown to be similar, finFETs 102A-102F can have gate structures with materials and/or electrical properties (e.g., threshold voltage, work function value) different from each other. Also, though gate structures 112 are shown to have horizontal GAA structures, other gate structures (e.g., vertical GAA structures or gate structures without GAA structures) are within the scope and spirit of this disclosure.

Referring to FIGS. 1A-1C, spacers 114 can form sidewalls of gate structures 112 and be in physical contact with portions of gate dielectric layers 113, according to some embodiments. Spacers 114 can include insulating material, such as silicon oxide, silicon nitride, a low-k material, or a combination thereof. Spacer 114 can include a single layer or a stack of insulating layers. Spacers 114 can have a low-k material with a dielectric constant less than about 3.9. In some embodiments, spacers 114 can include a material composed of silicon, oxygen, carbon, and/or nitrogen. The concentrations of silicon, oxygen, carbon, and nitrogen in the material for spacers 114 can depend on the desired dielectric constant for spacers 114. Varying concentrations of silicon, oxygen, carbon, and nitrogen in the material can vary the desired dielectric constant of spacers 114. In some embodiments, each spacer 114 can include a layer of silicon oxycarbonitride (SiOCN), a layer of silicon carbon nitride (SiCN), a layer of silicon oxide carbide (SiOC), or a combination thereof. In some embodiments, each spacer 114 can include a stack of a SiOCN layer disposed on a SiOC layer, which is disposed on a SiOCN layer. In some embodiments, each spacer 114 can have a thickness $S_t$ ranging from about 5 nm to about 12 nm. Other materials and dimensions for spacers 114 are within the scope and spirit of this disclosure.

FIGS. 1C-1D are cross-sectional views of PFET 102D. As shown in FIG. 1C, inner spacer structures 127 can be formed between epitaxial fin regions 110 and work function layers 130D. Inner spacer structures 127 can reduce the parasitic capacitance of finFETs 102A-102F. Each inner spacer structure 127 can have a low-k material with a dielectric constant less than about 3.9 or a high-k material with a dielectric constant ranging from about 4 to about 7. In some embodiments, inner spacer structures 127 can include a single layer or a stack of dielectric layers. In some embodiments, inner spacer structures 127 can include suitable dielectric material composed of silicon, oxygen, carbon, and/or nitrogen. The concentrations of silicon, oxygen, carbon, and nitrogen in the dielectric material for inner spacer structures 127 can depend on the desired dielectric constant. Varying concentrations of silicon, oxygen, carbon, and nitrogen in inner spacer structures 127 can vary its desired dielectric constant. Inner spacer structures 127 can be formed using SiOC, SiCN, SiOCN, SiN, silicon oxide ($SiO_x$), silicon oxynitride ($SiO_yN$) and/or a combination thereof, deposited by ALD, flowable CVD (FCVD), or other suitable methods.

Referring to FIGS. 1A-1D, semiconductor device 100 can further include an etch stop layer (ESL) (not shown), an interlayer dielectric (ILD) layer 118, and shallow trench isolation (STI) regions 138. The ESL can protect gate structures 112 and/or epitaxial fin regions 110. This protection can be provided, for example, during formation of ILD layer 118 and/or S/D contact structures (not shown in FIGS. 1A-1D). The ESL can be disposed on sidewalls of spacers 114. In some embodiments, the ESL can include, for example, silicon nitride ($SiN_x$), silicon oxide ($SiO_x$), silicon oxynitride (SiON), silicon carbide (SiC), silicon carbonitride (SiCN), boron nitride (BN), silicon boron nitride (SiBN), silicon carbon boron nitride (SiCBN), or a combination thereof. In some embodiments, the ESL can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, the ESL can have a thickness ranging from about 3 nm to about 30 nm. Other materials, formation methods, and thicknesses for ESL, are within the scope and spirit of this disclosure.

ILD layer 118 can be disposed on ESL and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, the flowable silicon oxide can be deposited using flowable CVD (FCVD). In some embodiments, the dielectric material is silicon oxide. In some embodiments, ILD layer 118 can have a thickness 118t in a range from about 50 nm to about 200 nm. Other materials, thicknesses, and formation methods for ILD layer 118 are within the scope and spirit of this disclosure.

STI regions 138 can provide electrical isolation between finFETs 102A-102F with fin structure 108 and neighboring finFETs with different fin structures (not shown) on substrate 106 and/or neighboring active and passive elements (not shown) integrated with or deposited on substrate 106. In some embodiments, STI regions 138 can include first and second protective liners 138A-138B and an insulating layer 138C disposed on second protective liner 138B. First and second protective liners 138A-138B can include materials different from each other. Each of first and second protective liners 138A-138B can include an oxide or nitride material. In some embodiments, first protective liner 138A can include a nitride material and second protective liner 138B can include an oxide material and can prevent oxidation of the sidewalls of fin top portion 108B during the formation of insulating layer 138C. In some embodiments, insulating layer 138C can include silicon oxide, silicon nitride, silicon oxynitride, fluorine-doped silicate glass (FSG), a low-k dielectric material, and/or other suitable insulating materials. In some embodiments, first and second protective liners 138A-138B each can have a thickness ranging from about 1 nm to about 2 nm. In some embodiments, STI regions 138 can have a vertical dimension $138_H$ (e.g., height) along a z-axis ranging from about 40 nm to about 60 nm. In some embodiments, vertical dimension $138_H$ can be half of the total height $H_T$ of fin structure 108.

The cross-sectional shapes of semiconductor device 100 and its elements (e.g., fin structure 108, gate structures 112, epitaxial fin regions 110, spacers 114, inner spacer structures 127 and/or STI regions 138) are illustrative and are not intended to be limiting.

Figure 2:
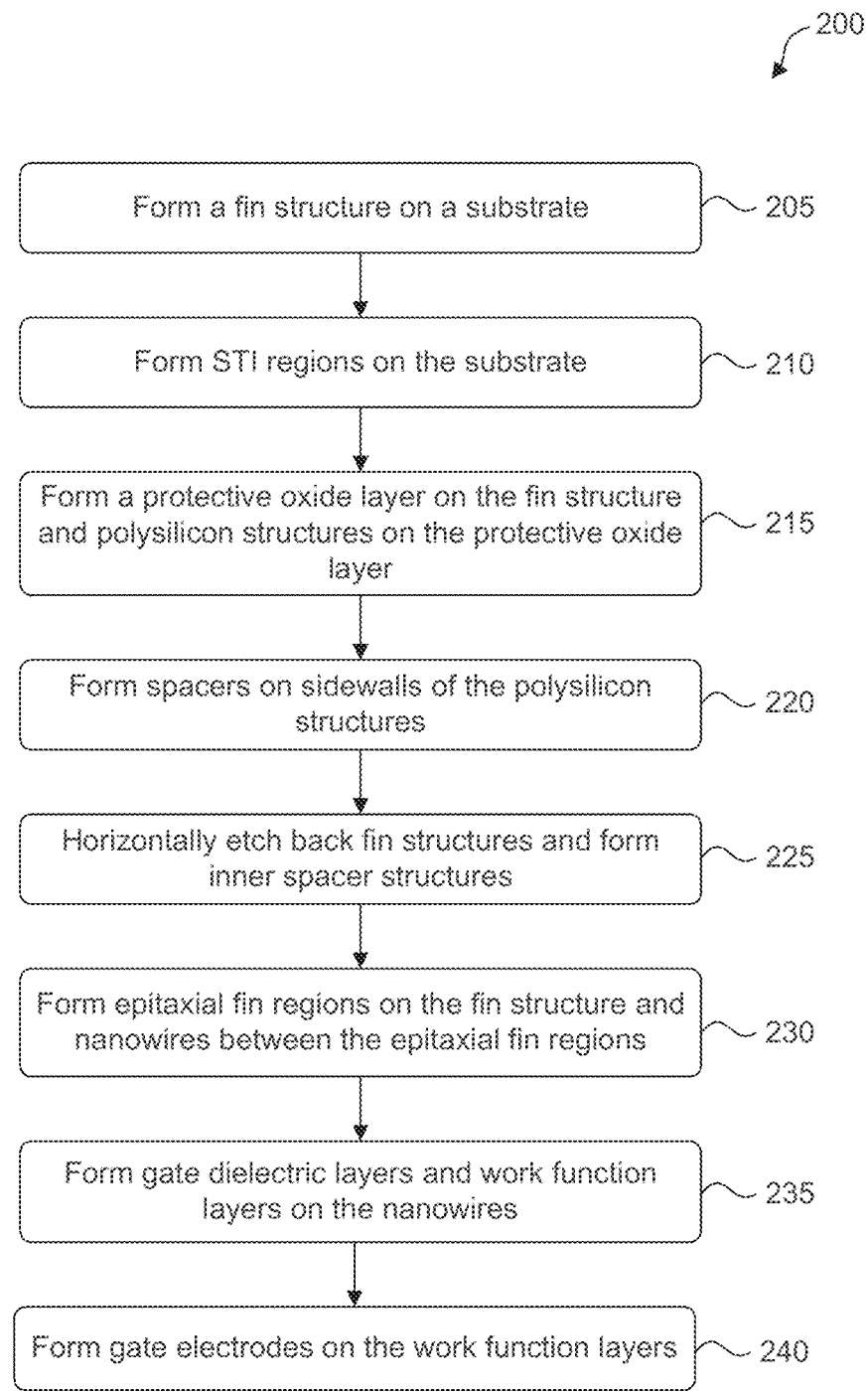
FIG. 2 is a flow diagram of a method for fabricating multi-threshold voltage semiconductor devices, in accordance with some embodiments.

FIG. 2 is a flow diagram of a method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-12B. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Similar elements in FIGS. 3A-12B and FIGS. 1A-1D are labelled with the same annotations for simplicity.

Figures 3A, 3B, 3C:
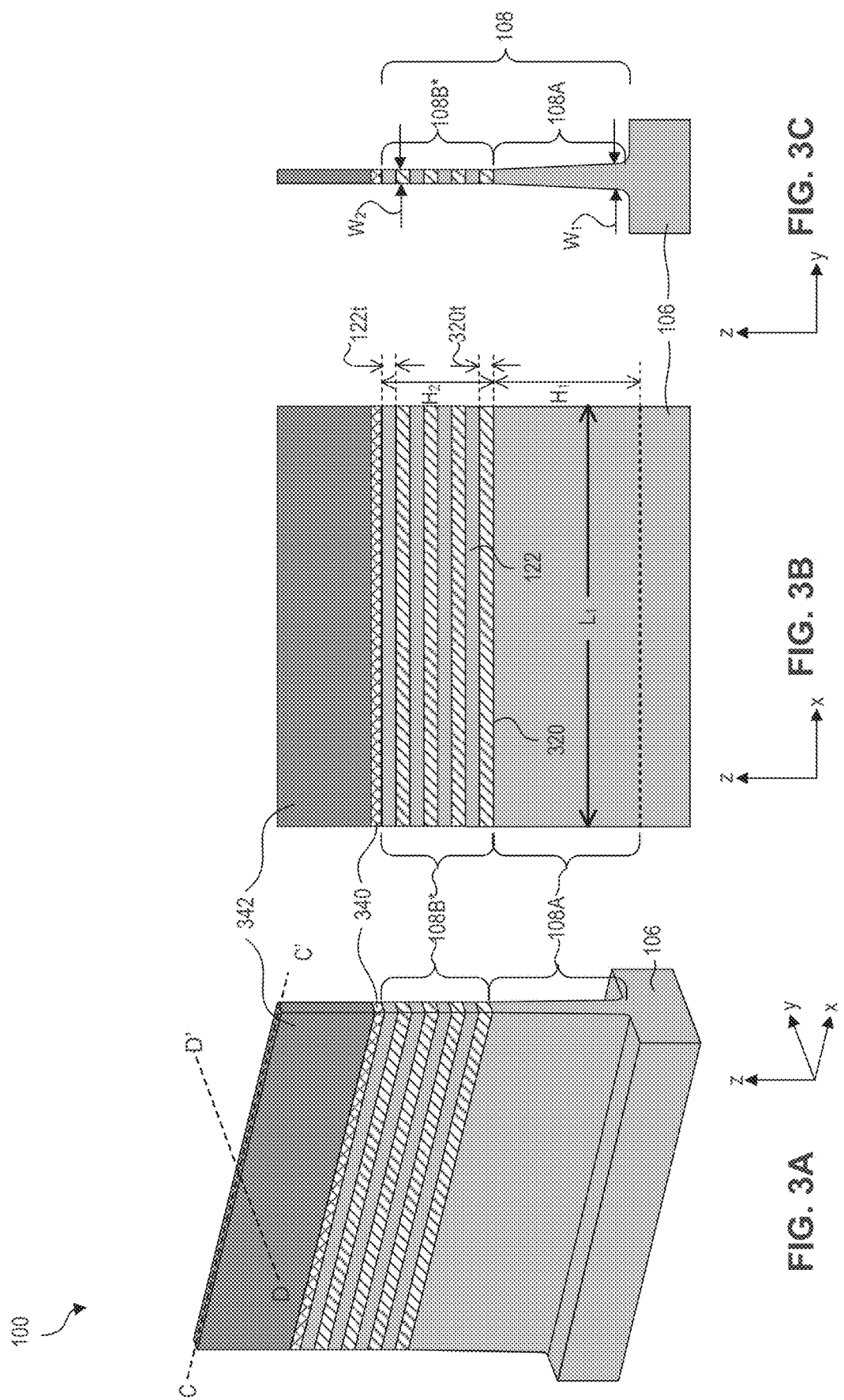
FIGS. 3A-3C, 4A-4C, 5A-5D, 6A-6D, 7A-7C, and 8A-8C illustrate various views of semiconductor devices having multi-threshold voltages at various stages of their fabrication process, in accordance with some embodiments.

Referring to FIG. 2, in operation 205, a fin structure is formed on a substrate, according to some embodiments. For example, fin structure 108 with fin base portion 108A and fin top portion 108B* can be formed on substrate 106 as described with reference to FIGS. 3A-3C. The formation of fin structure 108 can include the formation of fin base portion 108A and fin top portion 108B* on substrate 106 as shown in FIGS. 3A-3C. FIGS. 3B and 3C are cross-sectional views of FIG. 3A viewed through the cross-sectional surface of C-C' and D-D', respectively. The processing of fin top portion 108B*, described below, can form fin top portion 108B as described with reference to FIGS. 1A-1D.

Fin top portion 108B* can include first and second semiconductor layers 320 and 122 stacked in an alternating configuration. Each of first and second semiconductor layers 320 and 122 can be epitaxially grown on its underlying layer and can include semiconductor materials different from each other. In some embodiments, first and second semiconductor layers 320 and 122 can include semiconductor materials similar to or different from substrate 106. In some embodiments, first and second semiconductor layers 320 and 122 can include semiconductor materials with oxidation rates and/or etch selectivity different from each other. In some embodiments, each of first and second semiconductor layers 320 and 122 can include silicon germanium (SiGe) with Ge in a range from about 25 atomic percent to about 50 atomic percent with any remaining atomic percent being Si or can include Si without any substantial amount of Ge.

First and/or second semiconductor layers 320 and 122 can be undoped or can be in-situ doped during their epitaxial growth process using (i) p-type dopants, such as boron, indium, or gallium; and/or (ii) n-type dopants, such as phosphorus or arsenic. For p-type doping, p-type doping precursors, such as diborane ($B_2H_6$), boron trifluoride ($BF_3$), and/or other p-type doping precursors, can be used. For n-type in-situ doping, n-type doping precursors, such as phosphine ($PH_3$), arsine ($AsH_3$), and/or other n-type doping precursors, can be used. First and second semiconductor layers 320 and 122 can have respective vertical dimensions 320t and 122t (e.g., thicknesses) along a z-axis, each ranging from about 6 nm to about 10 nm. Vertical dimensions 320t and 122t can be equal to or different from each other. Though four layers of semiconductor layers 320 and 122 are shown in FIGS. 3A-3C, semiconductor device 100 can have any number of semiconductor layers 320 and 122.

Forming fin base portion 108A and fin top portion 108B* can include forming a stack of materials for first and second semiconductor layers 320 and 122 on substrate 106 and etching a portion of substrate 106 and the stack of materials through patterned hard mask layers 340 and 342 formed on the stack of materials. In some embodiments, hard mask layer 340 can be a thin film including silicon oxide formed, for example, using a thermal oxidation process. In some embodiments, hard mask layer 342 can be formed of silicon nitride using, for example, low pressure chemical vapor deposition (LPCVD) or plasma enhanced CVD (PECVD). The etching of the stack of materials can include a dry etch, a wet etch process, or a combination thereof. The dry etch process can include using etchants having an oxygen-containing gas, a fluorine-containing gas, a chlorine-containing gas, a bromine-containing gas, an iodine-containing gas, other suitable etching gases and/or plasmas, or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof.

In some embodiments, fin base portion 108A and fin top portion 108B* can have respective vertical dimensions $H_1$ and $H_2$ (e.g., heights) along a z-axis, each ranging from about 40 nm to about 60 nm. Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm. In some embodiments, fin structure 108 can have a horizontal dimension $L_1$ (e.g., length) along an x-axis ranging from about 100 nm to about 1 µm. In some embodiments, fin structure 108 can have a tapered cross-section along a yz-plane with a horizontal dimension $W_1$ (e.g., width) of fin base portion 108A along a y-axis being greater than a horizontal dimension $W_2$ of fin top portion 108B* along a y-axis. Horizontal dimension $W_1$ and $W_2$ can range from about 6 nm to about 20 nm.

Figure 4A:
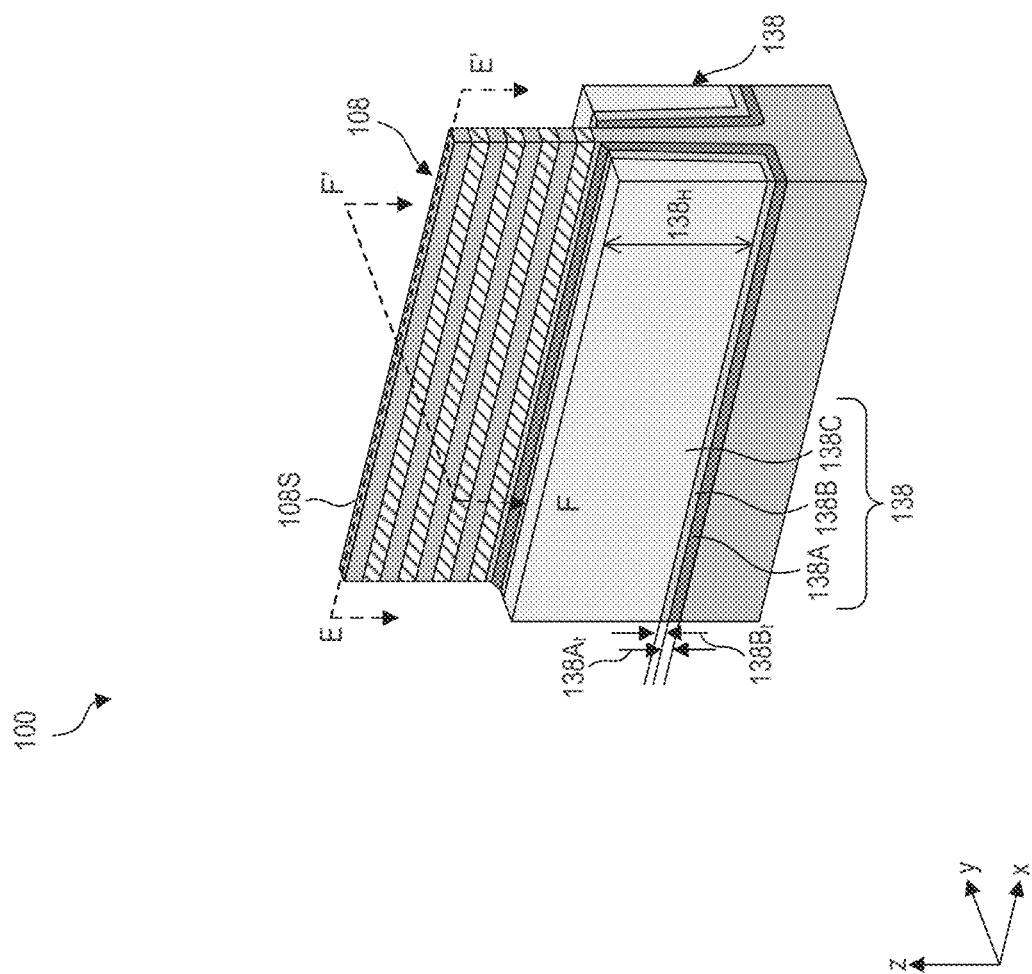
Figure 4C:
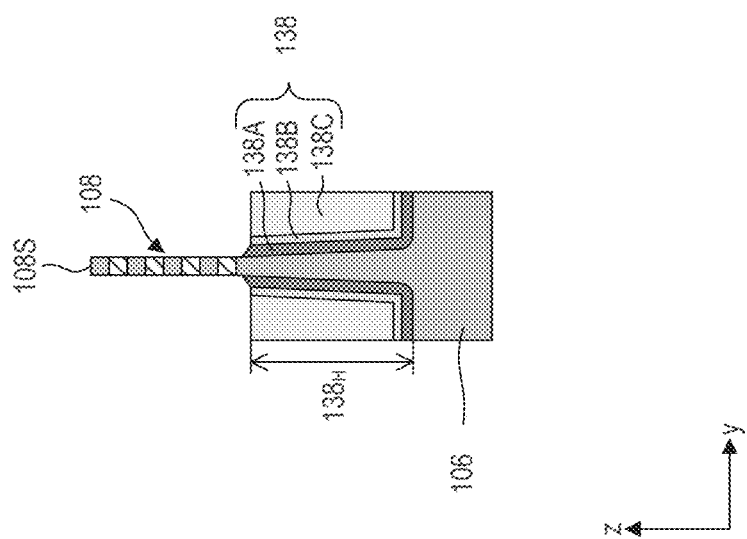
Figure 4B:
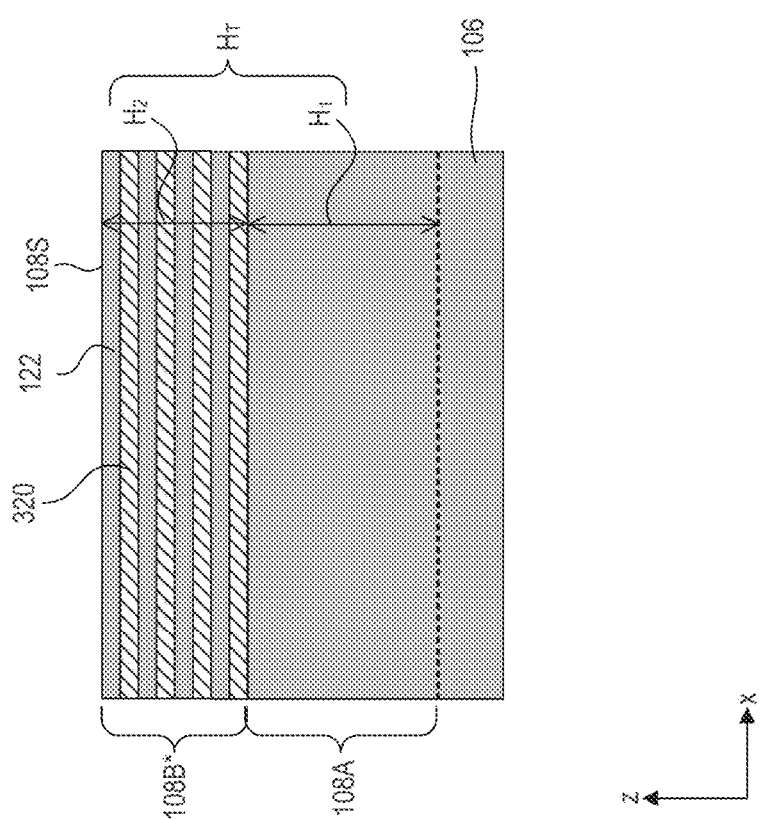

Referring to FIG. 2, in operation 210, STI regions are formed on the substrate, according to some embodiments. Referring to FIGS. 4A-4C, STI regions 138 with first and second protective liners 138A-138B and insulating layer 138C can be formed on substrate 106. Forming STI regions 138 can include (i) depositing a layer of nitride material (not shown) for first protective liners 138A on the structure of FIG. 3A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 4A. FIGS. 4B and 4C are cross-sectional views of FIG. 4A through lines E-E' and F-F', respectively.

The layers of nitride and oxide materials can be deposited using a suitable process for depositing oxide and nitride materials, such as ALD or CVD. These layers of oxide and nitride materials can prevent oxidation of the sidewalls of fin top portion 108B* during the deposition and annealing of the insulating material for insulating layer 138C.

In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane (SiH4) and oxygen ($O_2$) as reacting precursors. In some embodiments, the layer of insulating material can be formed using a sub-atmospheric CVD (SACVD) process or high aspect-ratio process (HARP), where process gases can include tetraethoxysilane (TEOS) and/or ozone ($O_3$).

In some embodiments, the layer of insulating material can be formed by depositing flowable silicon oxide using a flowable CVD (FCVD) process. The FCVD process can be followed by a wet anneal process. The wet anneal process can include annealing the deposited layer of insulating material in steam at a temperature in a range from about 200° C. to about 700° C. for a period in a range from about 30 min to about 120 min. The wet anneal process can be followed by the CMP process to remove the patterned hard mask layers 340 and 342 and portions of the layers of nitride, oxide, and insulating materials for layers 138A-138C to substantially coplanarize top surfaces of the layers of nitride, oxide, and insulating materials with top surface 108s (FIGS. 4A-4C) of fin structure 108. The CMP process can be followed by the etching process to etch the layers of nitride, oxide, and insulating materials to form the structure of FIG. 4A.

The etching of the layers of nitride, oxide, and insulating materials can be performed by a dry etch process, a wet etch process, or a combination thereof. In some embodiments, the dry etch process can include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a, sulfuric peroxide mixture (SPM), hot deionized water (DI water), or a combination thereof. In some embodiments, the wet etch process can include using ammonia ($NH_3$) and hydrofluoric acid (HF) as etchants and inert, gases, such as Ar, xenon (Xe), He, or a combination thereof. In some embodiments, the flow rate of HF and $NH_3$ used in the wet etch process can each range from about 10 sccm to about 100 sccm. In some embodiments, the wet etch process can be performed at a pressure ranging from about 5 mTorr to about 100 mTorr and a high temperature ranging from about 50° C. to about 120° C.

In some embodiments, first and second protective liners 138A-138B can have respective thicknesses 138At and 138Bt ranging from about 1 nm to about 2 nm. In some embodiments, STI regions 138 can have a vertical dimension $138_H$ (e.g., height) along a z-axis ranging from about 40 nm to about 60 nm. In some embodiments, vertical dimension $138_H$ can be half of the total height $H_T$ of fin structure 108. Other materials, formation methods, and dimensions for STI regions 138 are within the scope and spirit of this disclosure.

Figure 5A:
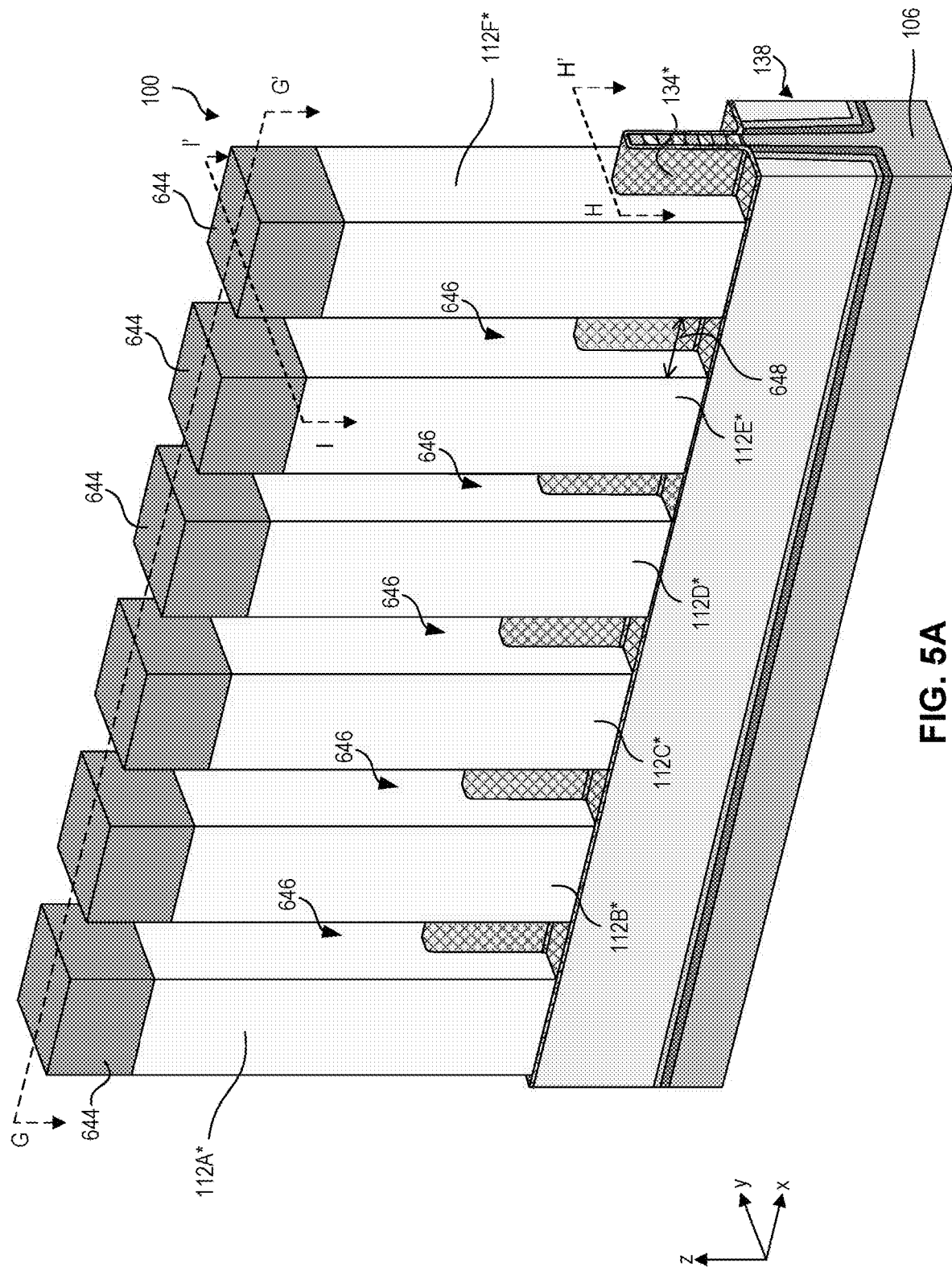
Figure 5B:
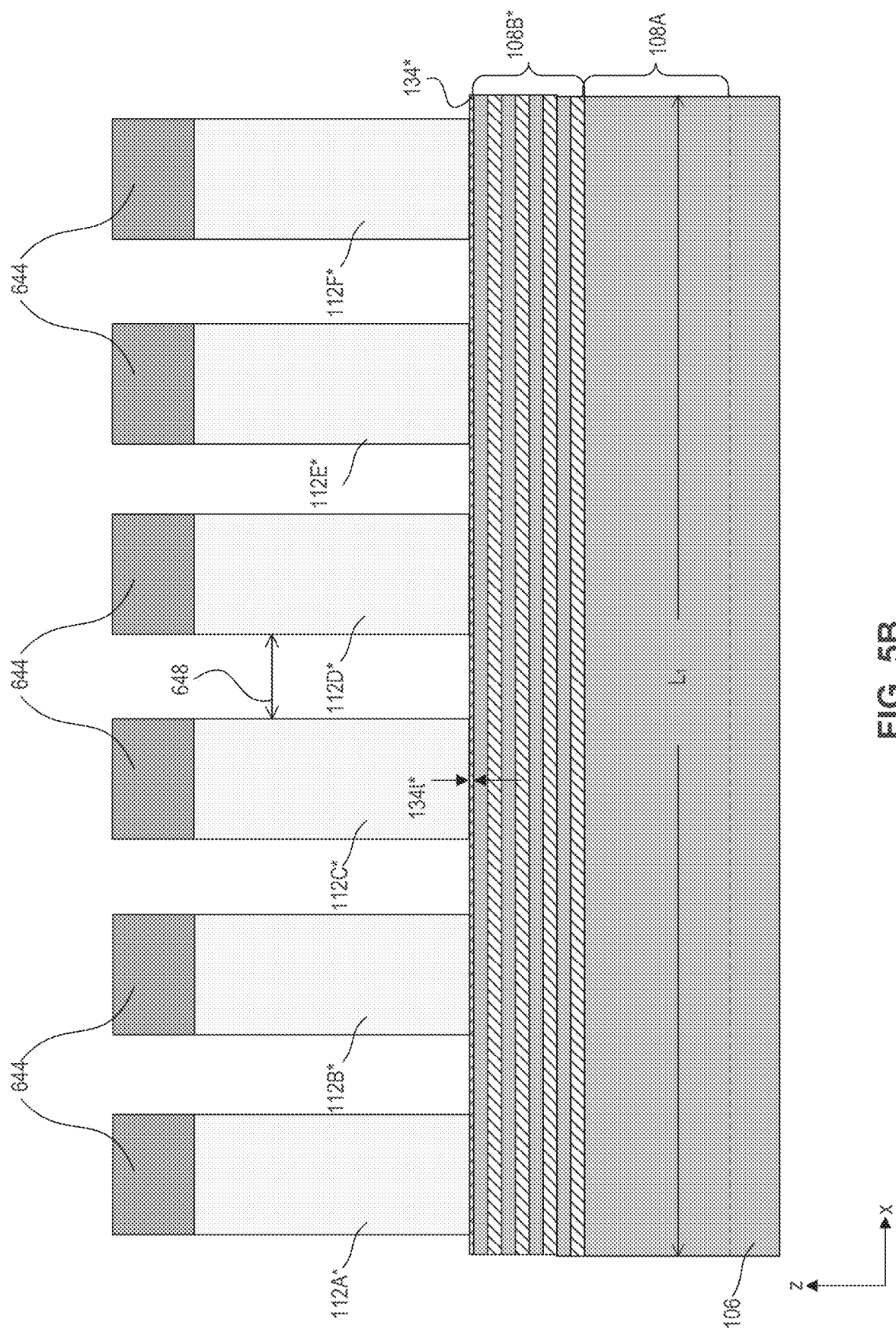
Figure 5C:
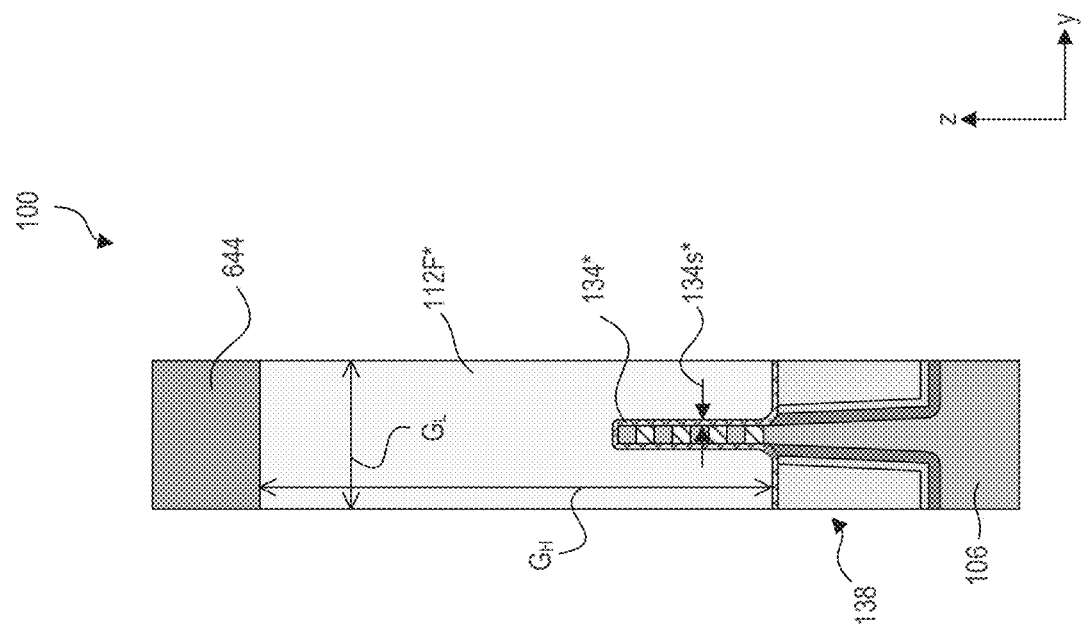
Figure 5C:
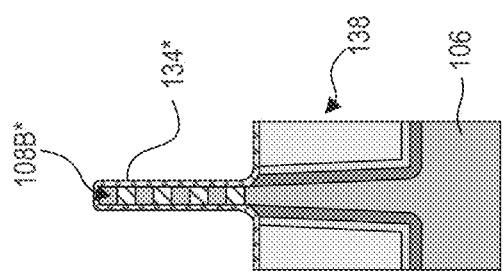
Figure 5D:

Referring to FIG. 2, in operation 215, a protective oxide layer is formed on the fin structure and polysilicon structures are formed on the protective oxide layer, according to some embodiments. Referring to FIGS. 5A-5D, a protective oxide layer 134* can be formed on fin structure 108 and STI regions 138 and polysilicon structures 112A*-112F* can be formed on protective oxide layer 134*. FIGS. 5B-5D are cross-sectional views of FIG. 5A as viewed from line G-G', H-H', and I-I', respectively. Formation of protective oxide layer 134* can include blanket depositing a layer of oxide material on the structure of FIG. 4A followed by a high temperature anneal process. Protective oxide layer 134* can include a suitable oxide material, such as silicon oxide, and can be blanket deposited using a suitable deposition process, such as CVD, ALD, plasma enhanced ALD (PEALD), physical vapor deposition (PVD), or e-beam evaporation. In some embodiments, the layer of oxide material can be deposited using PEALD at an energy ranging from about 400 W to about 500 W and at a temperature ranging from about 300° C. to about 500° C. The deposition of the layer of oxide material can be followed by a dry anneal process under oxygen gas flow at a temperature ranging from about 800° C. to about 1050° C. The oxygen precursor concentration can be in a range of about 0.5% to about 5% of the total gas flow rate. In some embodiments, the anneal process can be a flash process where the anneal time can be between about 0.5 s and about 5 s.

In some embodiments, protective oxide layer 134* can have a vertical dimension $134t*$ (e.g., thickness on top surface of fin structure 108) along a z-axis and a horizontal dimension 134s* (e.g., thickness on sidewalls of fin top portion 108B*) along a y-axis, each ranging from about 1 nm to about 3 nm. In some embodiments, dimension 134t* can be equal to or greater than dimension 134s*. Other oxide materials, formation methods, and thicknesses for protective oxide layer 134* are within the scope and spirit of this disclosure. The presence of protective oxide layer 134* allow etching polysilicon from high aspect ratio spaces 646 (e.g., aspect ratio greater than 1:15, 1:18, or 1:20) shown in FIG. 5A between adjacent polysilicon structures 112A*-112F* without substantially etching and/or damaging fin structure 108 during the formation of polysilicon structures 112A*-112F*.

In some embodiments, protective oxide layer 134* can be removed during a subsequent gate replacement process when finFETs 102A-102F are used as non-input/output (non-I/O) devices in core circuits (can be also referred to as "logic circuits" or "memory circuits") formed in core regions (can be also referred to as "logic regions" or "memory regions") of an integrated circuit (IC). In some embodiments, the non-I/O devices can be core devices, logic devices, and/or memory devices that are not configured to handle the input/output voltages/currents directly. In some embodiments, the non-I/O devices includes logic gates, such as NAND, NOR, INVERTER, or a combination thereof. In some embodiments, the non-I/O devices include a memory device, such as a static random-access memory (SRAM) device. In some embodiments, protective oxide layer 134* may not be removed and can form a part of gate dielectric layers of gate structures 112 when the finFETs are used as an I/O device in peripheral circuits (e.g., IO circuits) formed in peripheral regions (can be also referred to as "I/O regions" or "high voltage regions") of an IC. The I/O devices can be configured to handle the input/output voltages/currents of the IC and to tolerate a greater amount of voltage or current swing than the non-I/O devices.

The formation of protective oxide layer 134* can be followed by the formation of polysilicon structures 112A*-112F* as shown in FIGS. 5A-5D. During subsequent processing, polysilicon structures 112A*-112F* can be replaced in a gate replacement process to form gate structures 112 of finFETs 102A-102F, respectively, as shown in FIG. 1A. In some embodiments, the formation of polysilicon structures 112A*-112F* can include blanket depositing a layer of polysilicon material on the deposited protective oxide layer 134* and etching the layer of polysilicon material through a patterned hard mask layer 644 (shown in FIGS. 5A-5D) formed on the layer of polysilicon material. In some embodiments, polysilicon material can be undoped and hard mask layer 644 can include an oxide layer and/or a nitride layer. The oxide layer can be formed using a thermal oxidation process and the nitride layer can be formed by LPCVD or PECVD. Hard mask layer 644 can protect polysilicon structures 112A*-112F* from subsequent processing steps (e.g., during formation of spacers 114, epitaxial fin regions 110, and/or ILD layer 118).

The blanket deposition of the layer of polysilicon material can include CVD, PVD, ALD, or other suitable deposition processes. In some embodiments, etching of the deposited layer of polysilicon material can include a dry etch, a wet etching, or a combination thereof. In some embodiments, etching of the deposited layer of polysilicon material to form polysilicon structures 112A*-112F* can include four etching steps. The first polysilicon etch step can include using a gas mixture having hydrogen bromide (HBr), oxygen ($O_2$), fluoroform ($CHF_3$), and chlorine ($Cl_2$). The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and argon (Ar) at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. The first polysilicon etch step can have a higher polysilicon etch rate than the second, third, and/or fourth polysilicon etch steps. The first polysilicon etch step is used to etch unwanted portions of the blanket deposited layer of polysilicon material above fin structure 108. The second, third, and fourth polysilicon etch steps are used to etch unwanted portions of the blanket deposited layer of polysilicon material within high aspect ratio spaces 646.

In some embodiments, vertical dimensions $G_H$ of polysilicon structures 112A*-112F* along a z-axis can be in a range from about 100 nm to about 150 nm. In some embodiments, horizontal dimensions $G_L$ of polysilicon structures 112A*-112F* along an x-axis can be in a range from about 3 nm to about 30 nm. Polysilicon structures 112A*-112F* can have a high aspect ratio equal to or greater than about 9, where aspect ratio is a ratio of dimension $G_H$ to dimension $G_L$. In some embodiments, horizontal dimensions 648 along an x-axis (e.g., spacing) between adjacent polysilicon structures 112A*-112F* can be in a range from about 40 nm to about 90 nm. In some embodiments, horizontal dimensions 648 can be different between adjacent polysilicon structures. The sum of a value of dimension 648 and a value of dimension $G_L$ is referred to as "one contacted poly pitch (1CPP)." In some embodiments, horizontal dimension $L_1$ of fin structure along an x-axis can be at least 3CPP to prevent the relaxation of strain in fin structure 108, and consequently prevent the relaxation of strain in channel regions formed in stacked fin portions of second semiconductor layers 122 under gate structures 112 as discussed above.

Figure 6A:
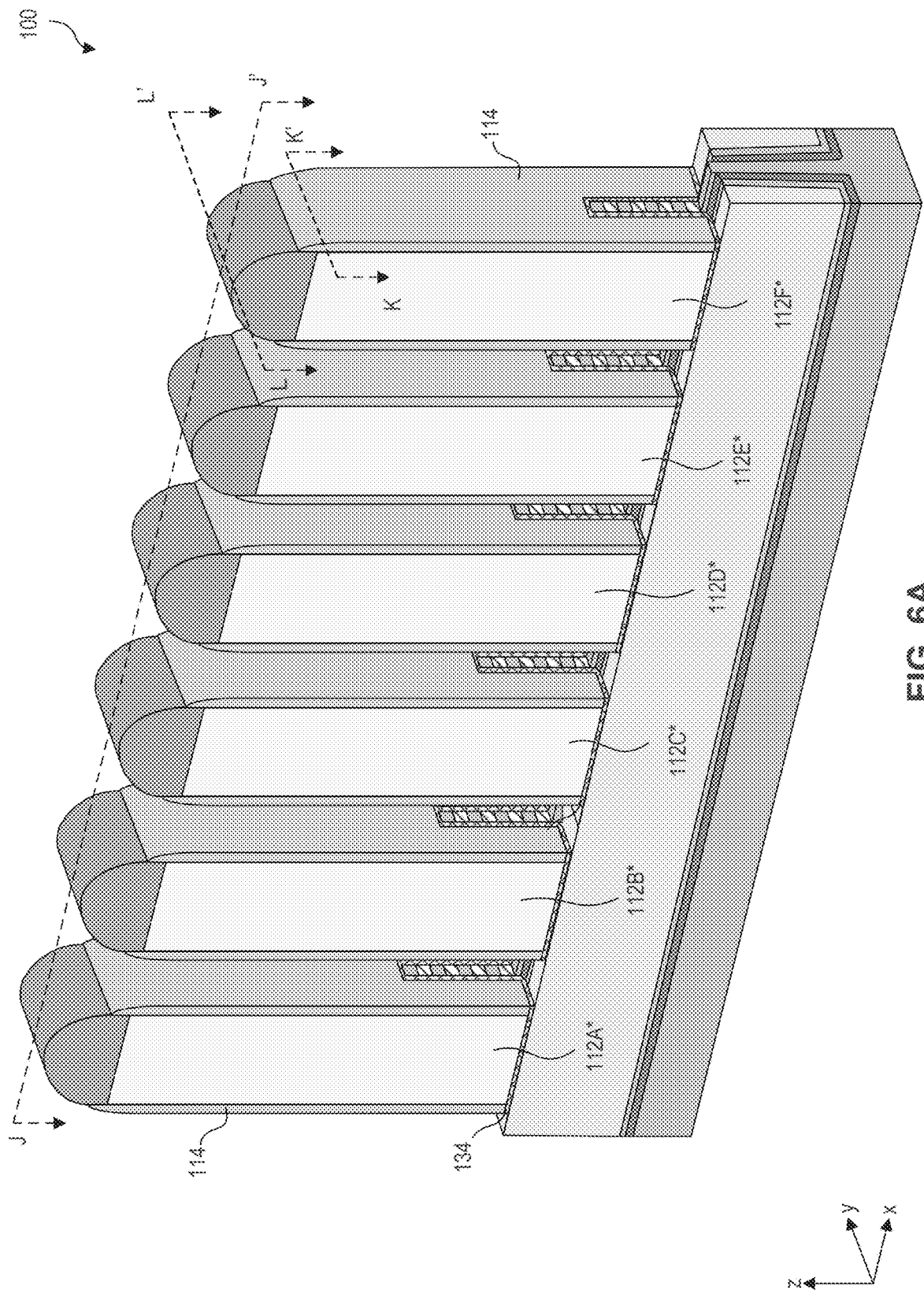
Figure 6B:
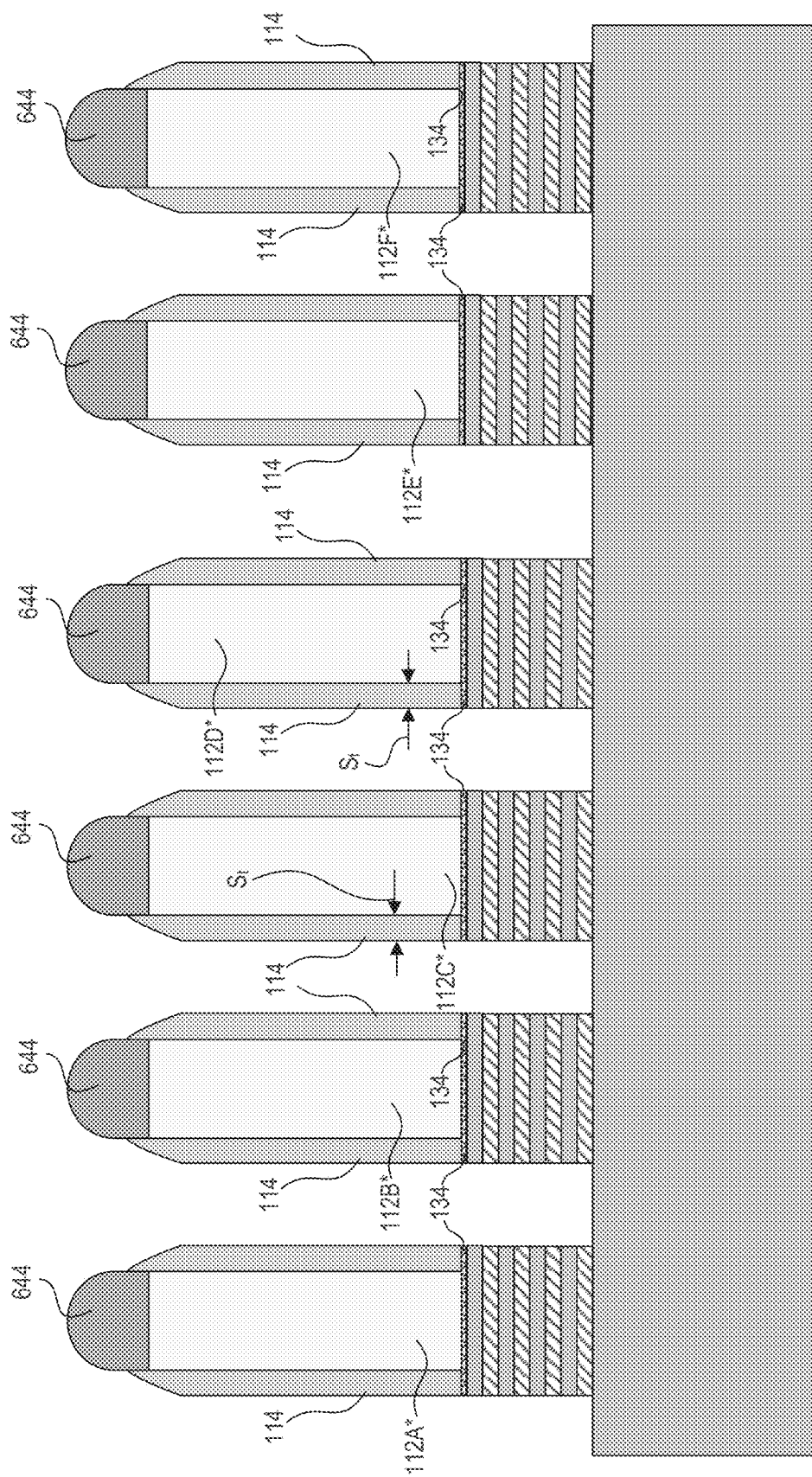
Figure 6D:
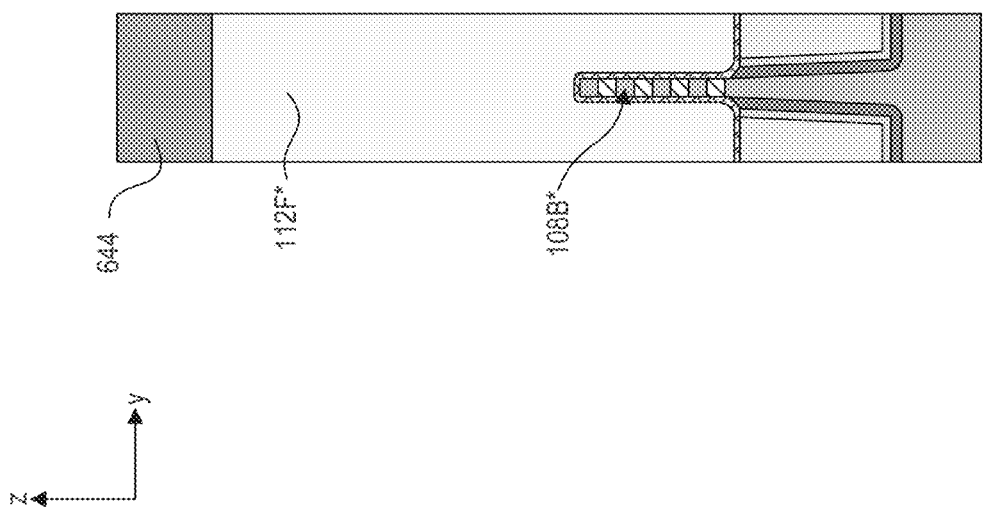
Figure 6C:
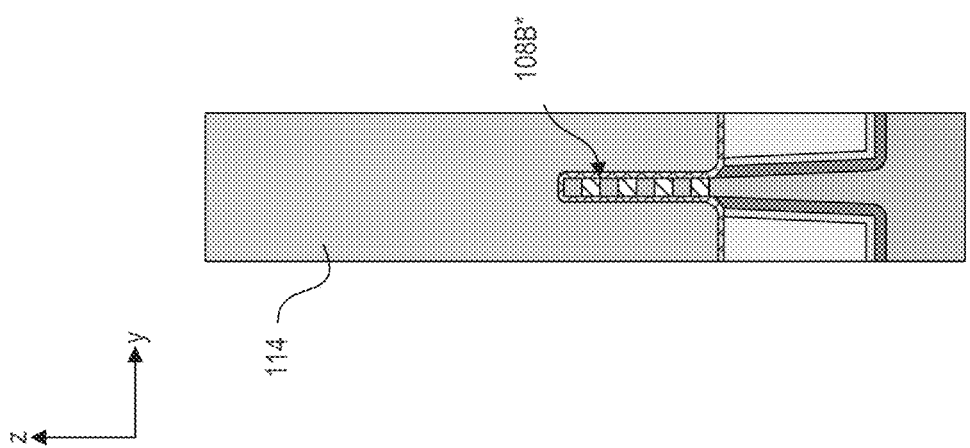

Referring to FIG. 2, in operation 220, spacers are formed on sidewalls of the polysilicon structures and fin top portions are etched, according to some embodiments. Referring to FIGS. 6A-6D, spacers 114 can be formed on sidewalls of polysilicon structures 112A*-112F*. FIGS. 6B-6D are cross-sectional views of FIG. 6A from lines J-J', K-K', and L-L', respectively. Forming spacers 114 can include blanket depositing a layer of an insulating material (e.g., an oxide, a nitride, and/or silicon carbon oxynitride material) on the structure of FIG. 5A by a CVD, a PVD, or an ALD process followed by photolithography and an etching process (e.g., reactive ion etching or other dry etching process using a chlorine or fluorine based etchant). Spacers 114 can each have a horizontal dimension $S_t$ (e.g., thickness) along an x-axis ranging from about 5 nm to about 12 nm, according to some embodiments. Forming of spacers 114 can be followed by forming oxide layer 134 (shown in FIGS. 6A-6D) underlying polysilicon structures 112A*-112F* by etching protective oxide layer 134* from regions not covered by polysilicon structures 112A*-112F* and spacers 114. The etch process can include a wet etch process using, for example, diluted HF.

A vertical etch of portions of fin top portion 108B* can be performed after forming oxide layer 134. The vertical etch includes etching fin top portion 108B* that are not underlying spacers 114 and polysilicon structures 112A*-112F* and can include a biased etching process. The biased etching process can be performed under a pressure in a range of about 1 mTorr to about 1000 mTorr, a power in range of about 50 W to about 1000 W, a bias voltage in a range of about 20 V to about 500 V, at a temperature in a range of about 40° C. to about 60° C., and using HBr and/or $Cl_2$ as etch gases. During the biased etching process, polysilicon structures 112A*-112F* can be protected from being etched by hard mask layer 644 and spacers 114.

Figure 7A:
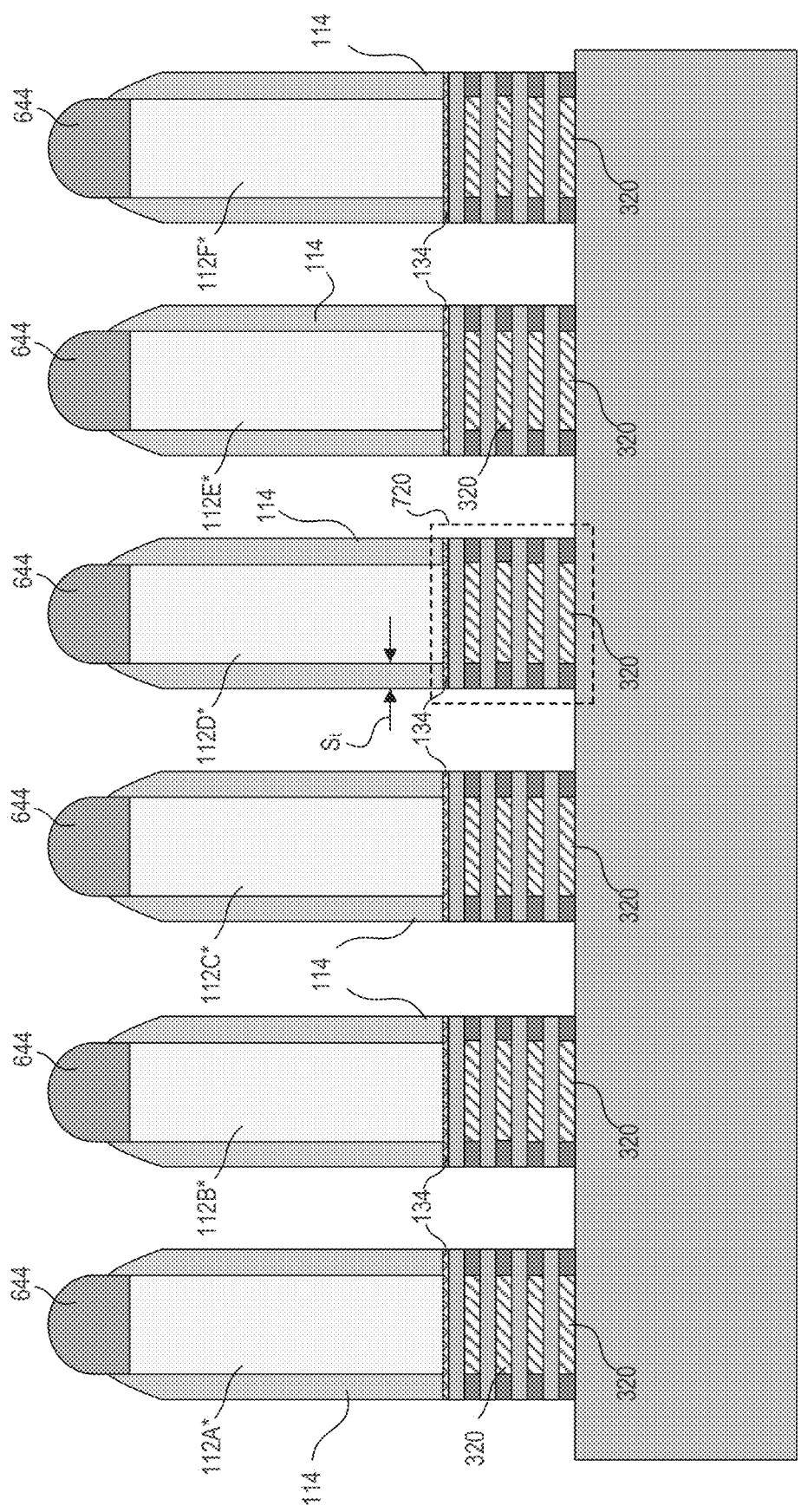
Figure 7C:
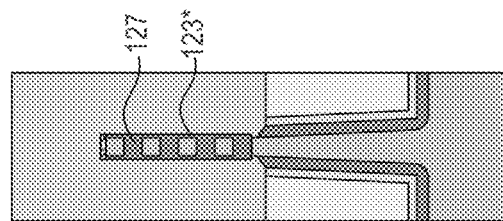
Figure 7B:
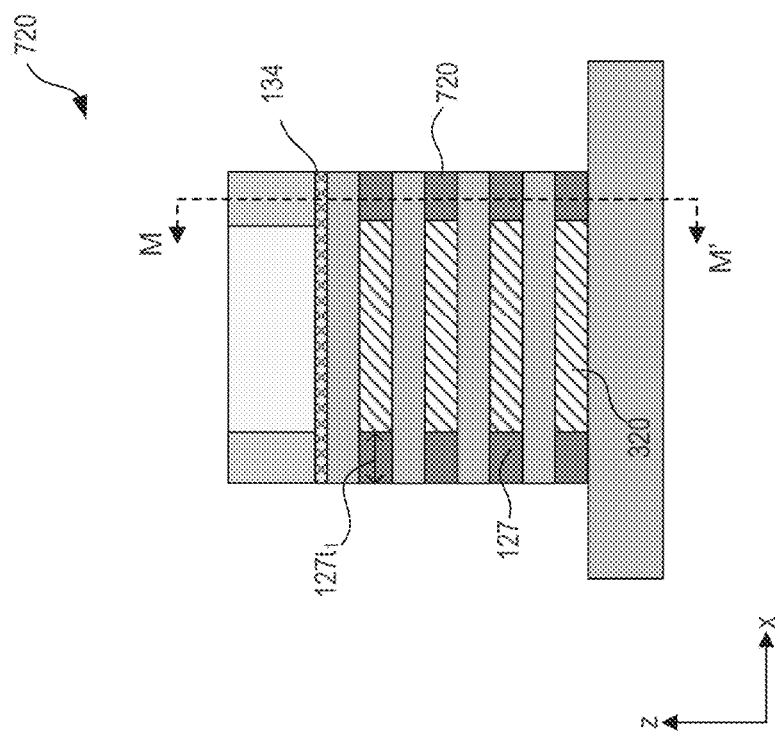

Referring to FIG. 2, in operation 225, a horizontal etch process is performed and inner spacer structures are formed in the fin structure, according to some embodiments. Referring to FIGS. 7A-7C, the vertical etch of the portions of fin top portions 108B* can be followed by a horizontal etch of portions of first semiconductor layers 320 below polysilicon structures 112A*-112F* and spacers 114 to form recessed regions. FIG. 7B is an enlarged view of region 720 shown in FIG. 7A. FIG. 7C is a cross-sectional view of the structure illustrated in FIG. 7B as viewed from the lines of M-M'. The horizontal etch can be performed by a dry etching process, a wet etching process, or a combination thereof. The etching process can include a plurality of cycles of etching and purging processes, such as about 3 to about 20 cycles of etching and purging processes. The etching process in each cycle can include using a gas mixture having hydrogen fluoride (HF), nitrogen trifluoride ($NF_3$), a fluorine based gas and a chlorine based gas. The gas ratio of the gas mixture of HF and $NF_3$ to the fluorine based gas can range from about 2 to about 30. The gas ratio of the gas mixture HF and $NF_3$ to the chlorine based gas can range from about 2 to about 40. The purging process in each cycle can include using a gas mixture having HF and nitrogen ($N_2$). HF in the purging process can remove by-product and/or clean the surface of etched portions for subsequent cycles. The purging process can be longer than the etching process in each cycle.

The process of forming recess regions can be followed by a blanket deposition of a dielectric material layer and a horizontal etch of the blanket deposited dielectric material layer to form inner spacer structures 127 within the recessed regions. In some embodiments, the blanket deposition process can include a plurality of cycles of deposition and etch processes. In each cycle, the etch process can follow the deposition process to prevent the formation of voids within inner spacer structures 127 by removing seams that can be formed during deposition of dielectric material layer within the recessed regions.

Inner spacer structures 127 can include a single layer or a stack of dielectric layers, deposited by ALD, FCVD, or other suitable methods. The etch process in each cycle of the blanket deposition process of dielectric material layer can include a dry etch process using a gas mixture of HF and $NH_3$. The gas ratio of HF to $NH_3$ can range from about 1 to about 20. Inner spacer structures 127 can include suitable dielectric material composed of silicon, oxygen, carbon, and/or nitrogen. Carbon concentration can be low in the dielectric material and can range from about 1% to about 15% because carbon concentration in the dielectric material higher than this range can lead to longer etch time and reduced etch selectivity.

The horizontal etch process of the blanket deposited dielectric material layer to form inner spacer structures 127 can be performed by a dry etch process using a gas mixture of HF and $NH_3$. The gas ratio of HF to $NH_3$ can range from about 1 to about 20. In some embodiments, inner spacer structures 127 can have a dimension $127t_1$ (e.g., thickness) along an x-axis ranging from about 3 nm to about 12 nm. Other methods of deposition and horizontal etch processes for forming inner spacer structures 127 and other suitable dimensions of inner spacer structures 127 are within the scope and spirit of this disclosure.

Figure 8A:
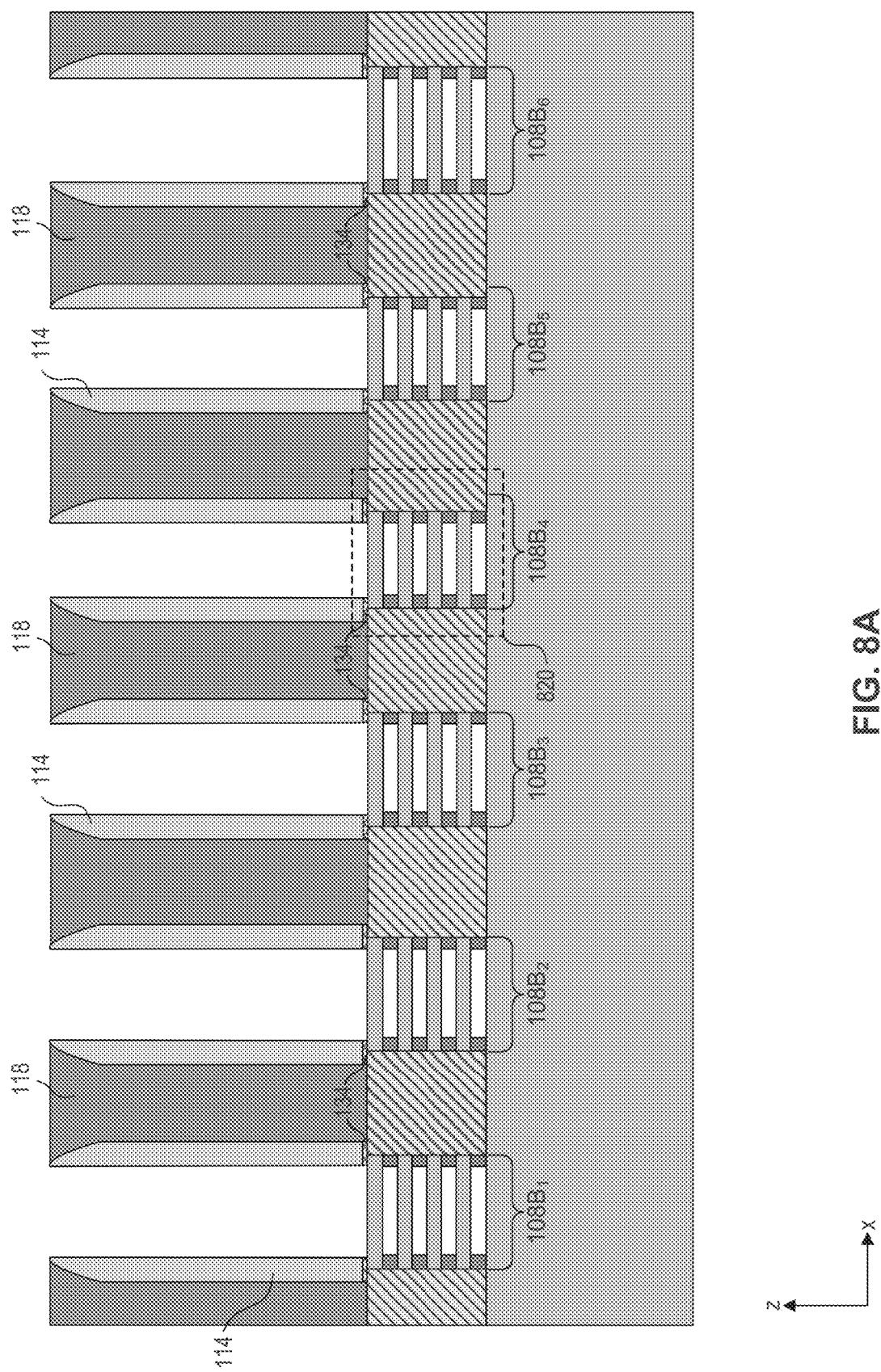
Figure 8C:
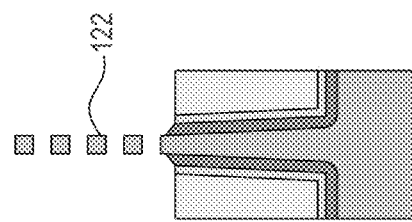
Figure 8B:
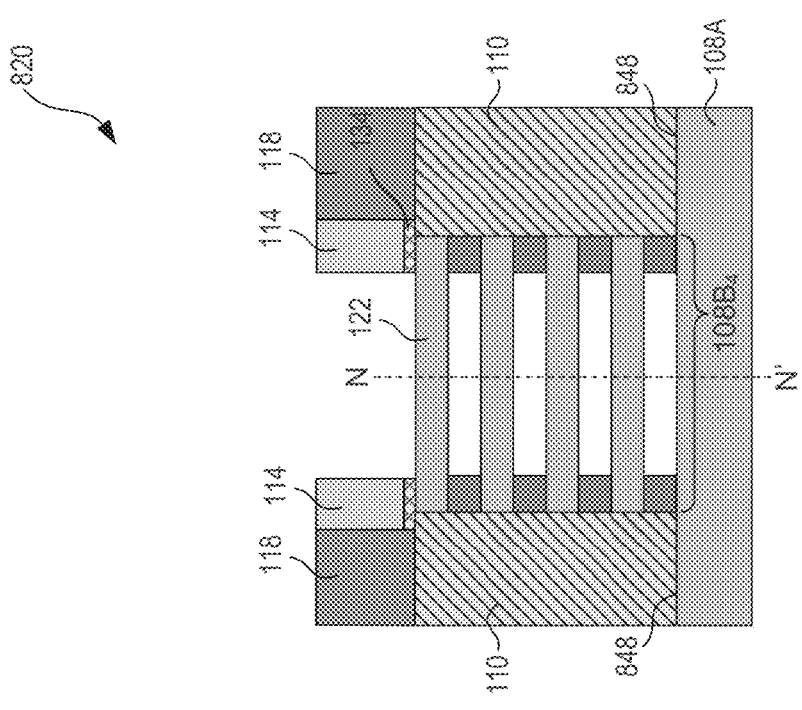

Referring to FIG. 2, in operation 230, epitaxial fin regions are formed on the fin structure and nanowires are formed between the epitaxial fin regions. Referring to FIGS. 8A-8C, epitaxial fin regions 110 can be grown on exposed surfaces of fin base portion 108A and on exposed surfaces of second semiconductor layers 122 of the structure of FIG. 7A. FIG. 8B is an enlarged view of region 820 illustrated in FIG. 8A. FIG. 8C is a cross-sectional view of the structure in FIG. 8B along the line N-N'.

In some embodiments, a portion of epitaxial fin regions 110 can be under spacers 114 and/or extend into fin base portion 108A. In some embodiments, epitaxial fin regions 110 can be grown by (i) CVD, such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110 can be grown by an epitaxial deposition/partial etch process, which repeats the epitaxial deposition/partial etch process at least once. In some embodiments, epitaxial fin regions 110 can be grown by selective epitaxial growth (SEG), where an etching gas is added to promote the selective growth of semiconductor material on the exposed surfaces of second semiconductor layers 122 and fin base portion 108A, but not on insulating materials.

In some embodiments, epitaxial fin regions 110 can be p-type or n-type. In some embodiments, p-type epitaxial fin regions 110 can include SiGe and can be in-situ doped during the epitaxial growth process using p-type dopants, such as boron, indium, or gallium. For p-type in-situ doping, p-type doping precursors, such as diborane ($B_2H_6$), boron trifluoride ($BF_3$), and/or other p-type doping precursors, can be used. In some embodiments, n-type epitaxial fin regions 110 can include Si without any substantial amount of Ge and can be in-situ doped during the epitaxial growth process using n-type dopants, such as phosphorus or arsenic. For n-type in-situ doping, n-type doping precursors, such as phosphine ($PH_3$), arsine ($AsH_3$), and/or other n-type doping precursors, can be used.

Each epitaxial fin region 110 can form S/D regions for finFETs 102A-102F. Second semiconductor layers 122 underlying polysilicon structures 112A*-112F* and interposed between adjacent S/D regions can form the channel regions of finFETs 102A-102F. In subsequent processing, gate-all-around (GAA) structures can be formed to wrap around each of the channel regions by replacing first semiconductor layers 320 (shown in FIGS. 7A-7B) of stacked fin portions $108B_1$-$108B_6$ underlying polysilicon structures 112A*-112F* with one or more layers of gate structures 112.

In some embodiments, fin base portion 108A underlying the etched portions of fin top portion 108B* between spacers 114 can be recessed during the vertical etch process described in operation 225. Interfaces 848 between epitaxial fin regions 110 and fin base portion 108A can be on the same plane as top surfaces of STI regions 138 or can be below the top surface planes of STI regions 138. Other dimensions and structures for epitaxial fin regions 110 are within the scope and spirit of this disclosure.

The process of forming epitaxial regions 110 can be followed by removing first semiconductor layers 320 of stacked fin portions $108B_1$-$108B_6$ to form nanowire-shaped second semiconductor layers 122, as shown in FIGS. 8A-8C. First semiconductor layers 320 can be removed by an etching process performed under a pressure in a range of about 1 mTorr to about 1000 mTorr, a power in range of about 50 W to about 1000 W, a bias voltage in a range of about 20 V to about 500 V, at a temperature in a range of about 40° C. to about 60° C., and using HBr and/or $Cl_2$ as etch gases. Other etching methods are within the scope and spirit of this disclosure.

Removing first semiconductor layers 320 can be followed by forming an etch stop layer (ESL) (not shown) on spacers 114 and on epitaxial fin regions 110. The formation of ILD layer 118 on the ESL can use a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using a FCVD process. The deposition process can be followed by a thermal annealing of the deposited layer of dielectric material in steam at a temperature ranging from about 200° C. to about 700° C. for a period ranging from about 30 minutes to about 120 minutes.

The process of forming ILD layer 118 can be followed by removing polysilicon structures 112A*-112F* using a dry etching process (e.g., reaction ion etching) or a wet etching process. In some embodiments, the gas etchants used in the dry etching process can include chlorine, fluorine, bromine, or a combination thereof. In some embodiments, an ammonium hydroxide ($NH_4OH$), sodium hydroxide (NaOH), and/or potassium hydroxide (KOH) wet etch can be used to remove polysilicon structures 112A*-112F*, or a dry etch followed by a wet etch process can be used to remove polysilicon structures 112A*-112F*. The exposed portions of oxide layer 134 can be removed using a dry etching process (e.g., reaction ion etching), a wet etching process (e.g., using diluted HF), or a combination thereof. In some embodiments, the gas etchants used in the dry etching process can include chlorine, fluorine, bromine, or combinations thereof. In some embodiments, oxide layer 134 may not be removed.

Figure 9:
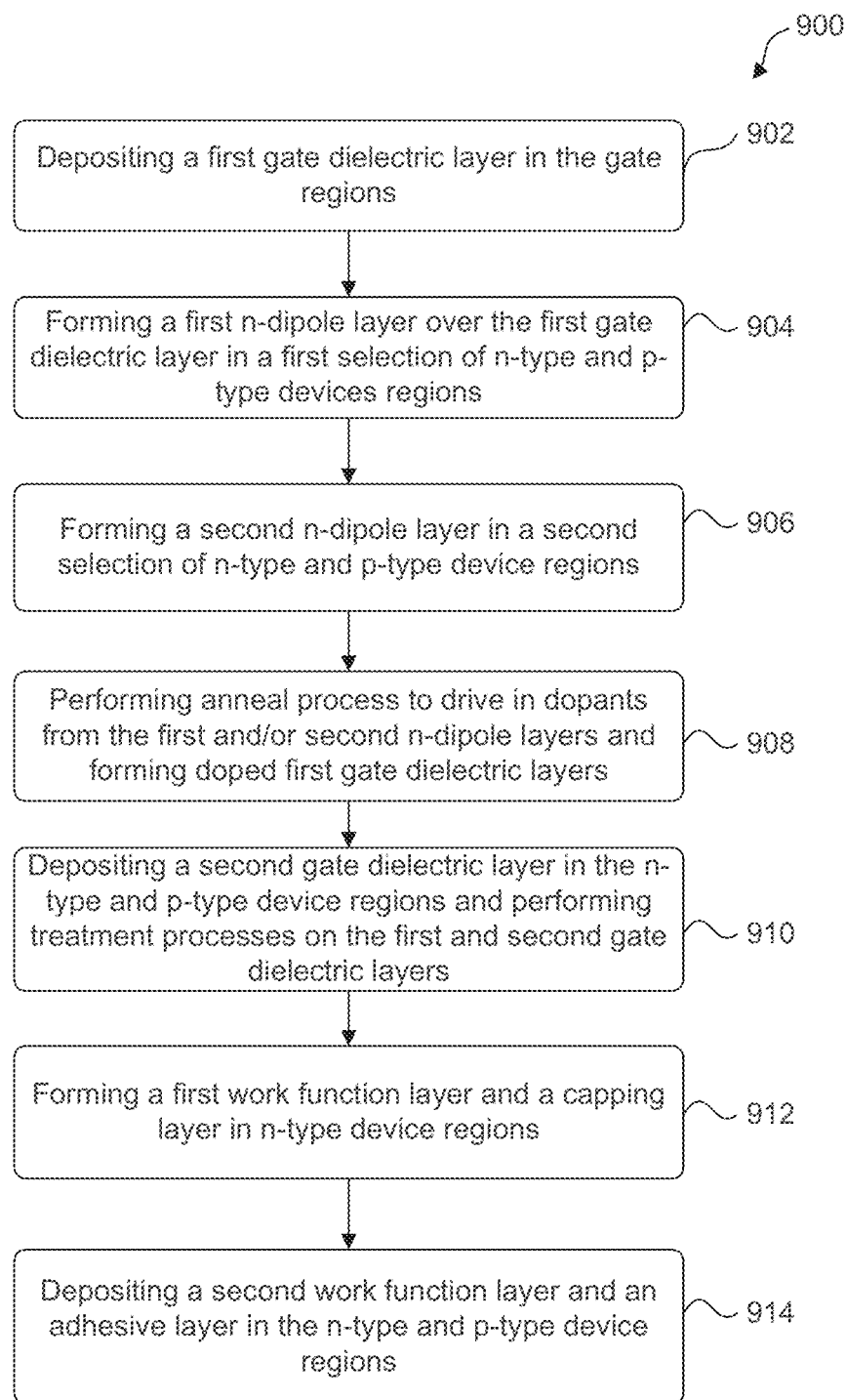
FIG. 9 is a flow diagram of a method for forming doped gate dielectric layers and multiple work function layers for multi-threshold semiconductor devices, in accordance with some embodiments.
Figure 10A:
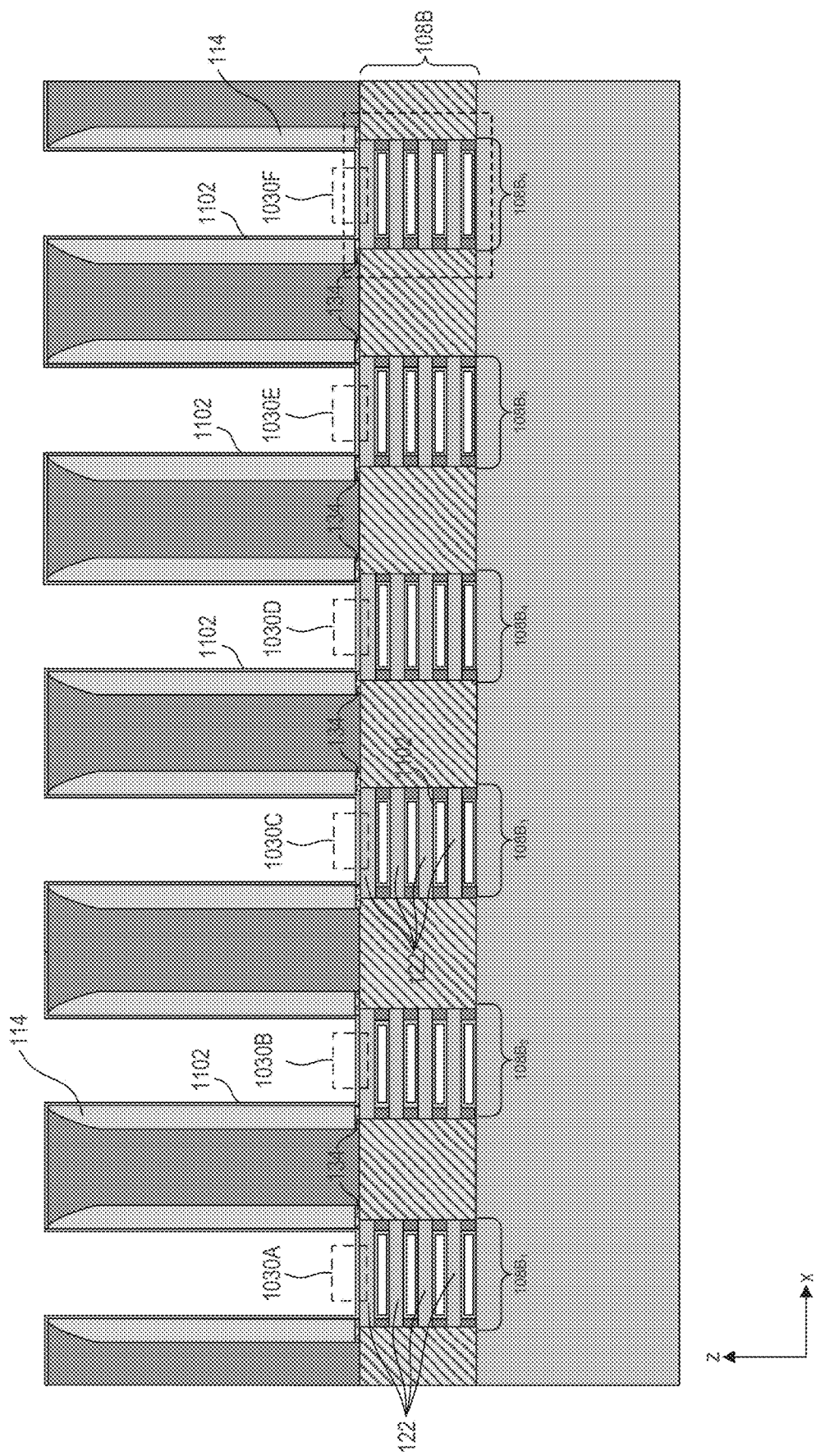

Referring to FIG. 2, in operation 235, gate dielectric layers and work function layers are formed on the nanowires, according to some embodiments. Gate dielectric layers 120A-120F can be wrapped around on exposed nanowires, such as nanowire-shaped second semiconductor layers 122 of stacked fin portions $108B_1$-$108B_6$. In some embodiments, a selection of gate dielectric layers 120A-120F can be intrinsic or doped with suitable material. Work function layers 130A-130F are respectively formed in finFETs 102A-102F. The various gate dielectric layer and work function layer combination can provide various threshold voltages across finFETs 102A-102F. FIG. 9 is a flow diagram of a method 900 for forming work function layers on gate dielectric layers, according to some embodiments. Method 900 is an example for performing operation 235. For illustrative purposes, the operations illustrated in FIG. 900 will be described with reference to the example fabrication process as illustrated in FIGS. 10A-11K. FIGS. 10A-11J are enlarged views of regions 1030A-1030D in FIG. 10A to illustrate the exemplary fabrication flow of method 900 for forming gate dielectric layers 120A-120F and work function layers 130A-130F, and other structures are omitted in FIGS. 10A-11K for simplicity. Operations in method 900 can be performed in a different order or not performed depending on specific applications. It should be noted that method 900 may not produce a complete semiconductor device. Accordingly, it is understood that additional processes can be provided before, during, and after method 900, and that some other processes may only be briefly described herein.

Each gate dielectric layer 120A-120F formed using method 900 can include doped or intrinsic gate dielectric layers. In some embodiments, a selection of gate dielectric layers can be doped with different dopant concentrations to form various electric dipoles between the gate dielectric layer and the work function layers. Each subsequently formed work function layer 130A-130D can include one or more work function metal layers. The gate dielectric layers and work function layers can provide multi-threshold voltages across finFETs 102A-102F such that devices formed on substrate 106 can have different threshold voltages. In some embodiments, finFETs 102A-102C can be NFETs and finFETs 102D-102F can be PFETs. In some embodiments, finFETs 102A and 102F can be ultra-low threshold voltage devices, finFETs 102B and 102E can be low threshold voltage devices, and finFETs 102C and 102D can be standard threshold voltage devices.

Referring to FIG. 9, at operation 902, a first gate dielectric layer is deposited in the gate regions, according to some embodiments. First gate dielectric material 1102 can be formed of a high-k dielectric material. For example, first gate dielectric material 1102 can be formed using a hafnium-based dielectric material, such as hafnium dioxide. In some embodiments, first gate dielectric material 1102 can be formed using other suitable gate dielectric material, such as silicon oxide or any other suitable dielectric material. First gate dielectric material 1102 can be deposited using ALD, CVD, PVD, any suitable deposition methods, and/or combinations thereof. In some embodiments, first gate dielectric material 1102 can be deposited using ALD and using hafnium chloride and water as precursors. In some embodiments, other suitable precursors can be used. First gate dielectric material 1102 can be formed on exposed surfaces of semiconductor layers 122, spacers 114, and ILD 118. The deposition process can be a timed deposition process where the process continues for a specified time until a nominal thickness has been achieved. In some embodiments, thickness $1102t$ of first gate dielectric material 1102 can be between about 5 Å and about 15 Å. For example, thickness $1102t$ can be between about 5 Å and about 10 Å, between about 10 Å and about 13 Å, or between about 13 Å and about 15 Å. In some embodiments, thickness $1102t$ can be between about 8 Å and about 12 Å. In some embodiments, a greater thickness $1102t$ can provide a greater tuning of threshold voltage. For example, a greater thickness $1102t$ can provide a greater change in threshold voltage. An interface layer (not shown in FIGS. 10A-10C but shown in FIGS. 11A-11J) can be formed prior to the deposition of first gate dielectric layer and on the exposed semiconductor layers 122. The interface layer can provide a variety of functions, such as serving as a binding layer and/or as a barrier layer. In some embodiments, the interface layer can be formed using silicon oxide, aluminum oxide, titanium oxide, tantalum oxide, titanium nitride, any suitable dielectric material, and/or combinations thereof.

Figure 11A:
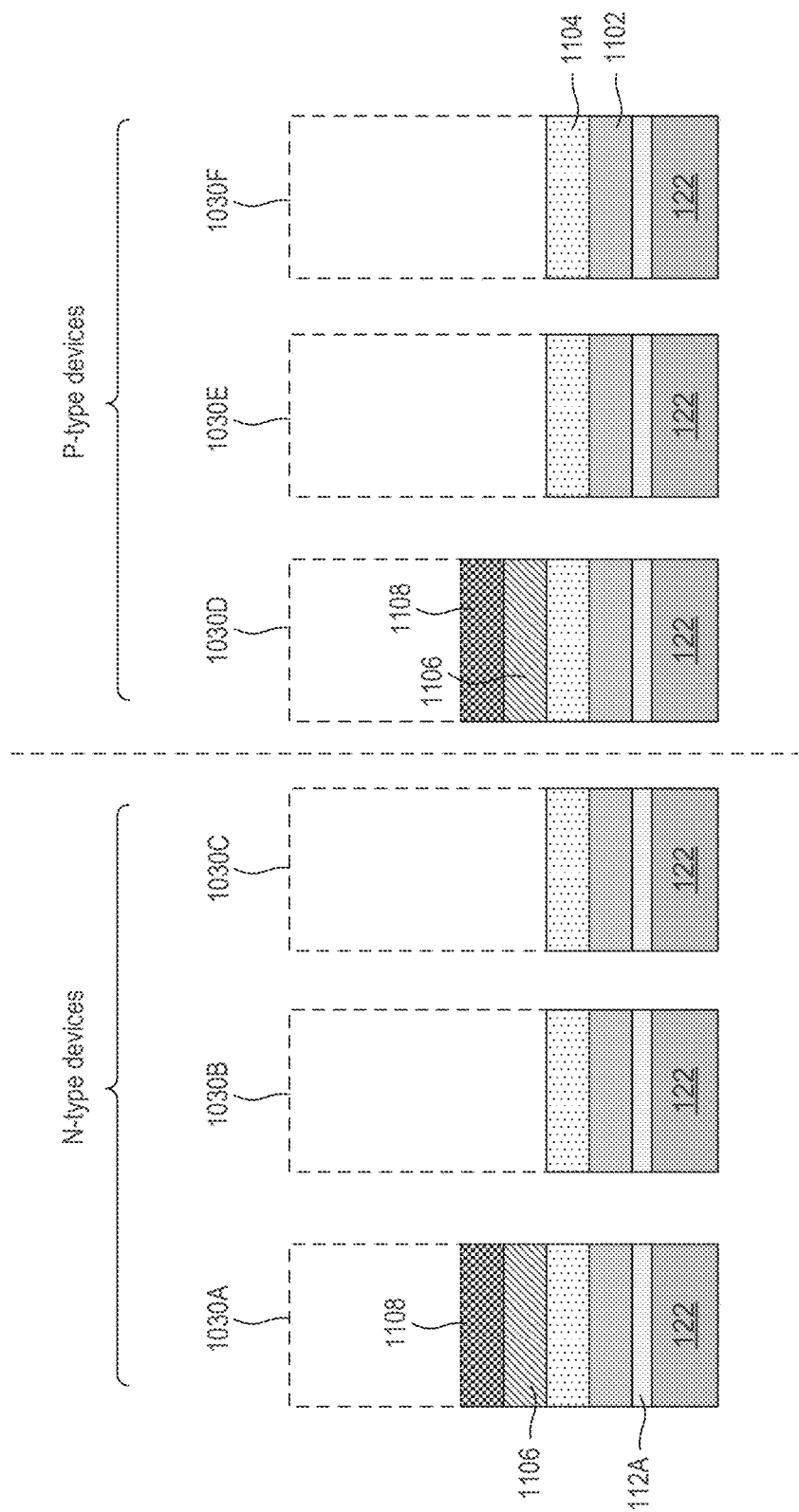
Figure 11B:
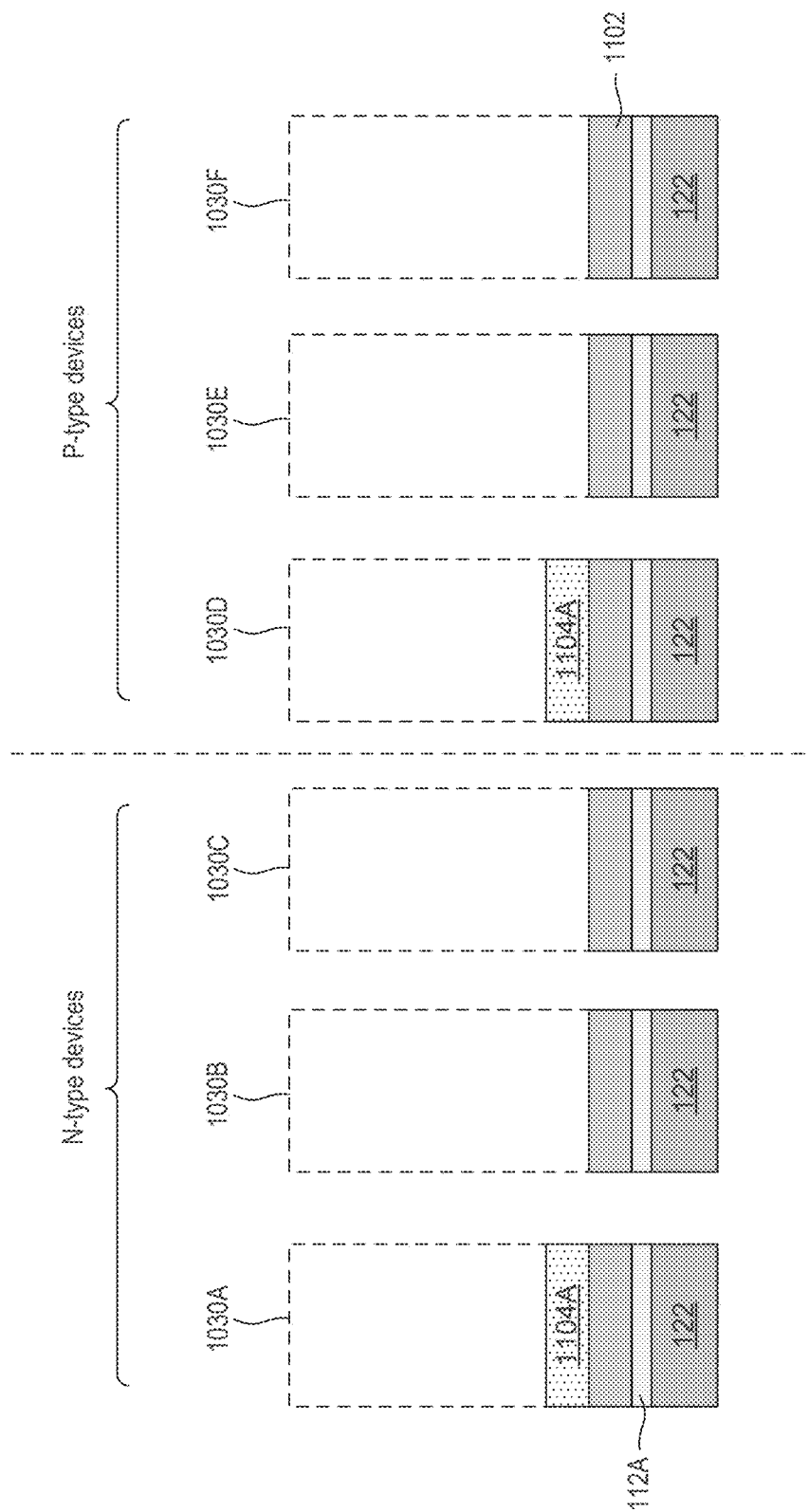

Referring to FIG. 9, at operation 904, a first dopant layer is formed on the first gate dielectric layer in a first selection of n-type and p-type device regions, according to some embodiments. Referring to FIGS. 11A-11B, first dopant layer 1104A is formed in a first selection of n-type and p-type device regions. Dopant layers can act as sources of dopants and during suitable treatment processes can provide such dopants to other suitable layers that are in contact with the dopant layers. First dopant layer 1104A can be formed by first depositing a first dopant material in all exposed device regions and removing portions of the first dopant material such that the remaining first dopant material forms first dopant layer 1104A in a first selection of n-type and p-type device regions. For example, the first selection of device regions can include regions for forming ultra-low threshold voltage n-type devices and/or standard threshold voltage p-type devices. These devices would subsequently include gate dielectric layers having higher dopant concentration level than other devices, such as low threshold voltage n-type or p-type devices.

As shown in FIG. 11A, first dopant material 1104 is deposited in all exposed device regions 1030A-1030F through a blanket deposition process. In some embodiments, first dopant material 1104 can be deposited on an interface layer 112A that is formed on semiconductor layers 122. Interface layer 112A can be formed using any suitable dielectric material, such as silicon oxide, aluminum oxide, silicon nitride, titanium nitride, tantalum nitride, and/or combinations thereof. In some embodiments, interface layer 112A can have a thickness between about 8 Å and about 12 Å. Interface layer 112A can be used as a binding layer, a barrier layer, or any suitable purposes. First dopant material 1104 can include material that contain suitable dopants that can be driven into first gate dielectric and subsequently forming electric dipoles. For example, first dopant material 1104 can be a dielectric material containing lanthanum, magnesium, silicon, yttrium, gadolinium, strontium, any suitable material, and/or combinations thereof. In some embodiments, first dopant material 1104 can include lanthanum oxide ($La_2O_3$). In some embodiments, first dopant material 1104 can include magnesium oxide, silicon oxide, yttrium oxide, and/or any other suitable material. In some embodiments, first dopant material 1104 containing lanthanum oxide can be deposited using ALD and using Tris(N, N'-di-i-propylformamidinato)lanthanum(III) ($La(FAMD)_3$) as a precursor. In some embodiments, first dopant material 1104 containing lanthanum oxide can be deposited using ALD and using metal precursors, such as $La(thd)_3$ where the thd compound contains 2,2,6,6-tetramethyl-3,5-heptanedione and oxygen precursors, such as ozone ($O_3$). In some embodiments, first dopant material 1104 can be deposited to a thickness between about 3 Å and about 10 Å. For example, first dopant material 1104 can have a thickness between about 3 Å and about 5 Å, between about 5 Å and about 10 Å. In some embodiments, dopant material 1104 can have a thickness above about 10 Å. A greater thickness of dopant material 1104 can provide a greater source of dopants such that a greater dopant concentration level can be achieved in the underlying first gate dielectric material 1102 after the drive in process.

Blocking layer 1106 can be formed on first dopant material 1104 and used to pattern the underlying first dopant material 1104 such that first dopant material 1104 can be formed in regions 1030A and 1030D. Blocking layer 1106 can be formed by blanket depositing blocking material on first dopant material 1104 followed by a patterning process. For example, blocking layer 1106 can be formed of a hard mask material, such as aluminum oxide. In some embodiments, blocking layer 1106 containing aluminum oxide can be formed by an ALD process using Trimethylamine (TMA) and water as precursors. In some embodiments, the ALD process can be performed using about 20 to about 30 processing cycles. In some embodiments, blocking layer 1106 can be deposited at a temperature between about 200° C. and about 250° C., between about 250° C. and about 300° C., or at any suitable temperature. Blocking layer 1106 can be patterned using a patterning process, such as depositing a photoresist material on blocking layer 1106, exposing the deposited photoresist material to a pattern, performing post-exposure bake processes, and developing the photoresist layer to form a masking element 1108 protecting underlying hard mask layer 1106 in regions 1030A and 1030D.

As shown in FIG. 11B, etching processes are performed to remove portions of the deposited first dopant material to form a first dopant layer over the first gate dielectric layer in a first selection of n-type and p-type device regions. Referring to FIG. 11B, suitable etching processes are performed to remove portions of first dopant material 1104 not protected by blocking layer 1106 and masking element 1108. In some embodiments, portions of first dopant material 1104 can be removed by a wet etch process. First dopant material 1104 can be etched away using chemical solutions, such as hydrochloric acid, hydrogen peroxide, any suitable etching solutions, and/or combinations thereof. Hard mask layer 1104 can also be removed by dry etching. In some embodiments, the etching process continues until underlying first gate dielectric material 1102 is exposed. The remaining first dopant material 1104 forms first dopant layer 1104A in a first selection of n-type and p-type device regions, such as device region 1030A for n-type devices and 1030D for p-type devices.

Figure 11C:
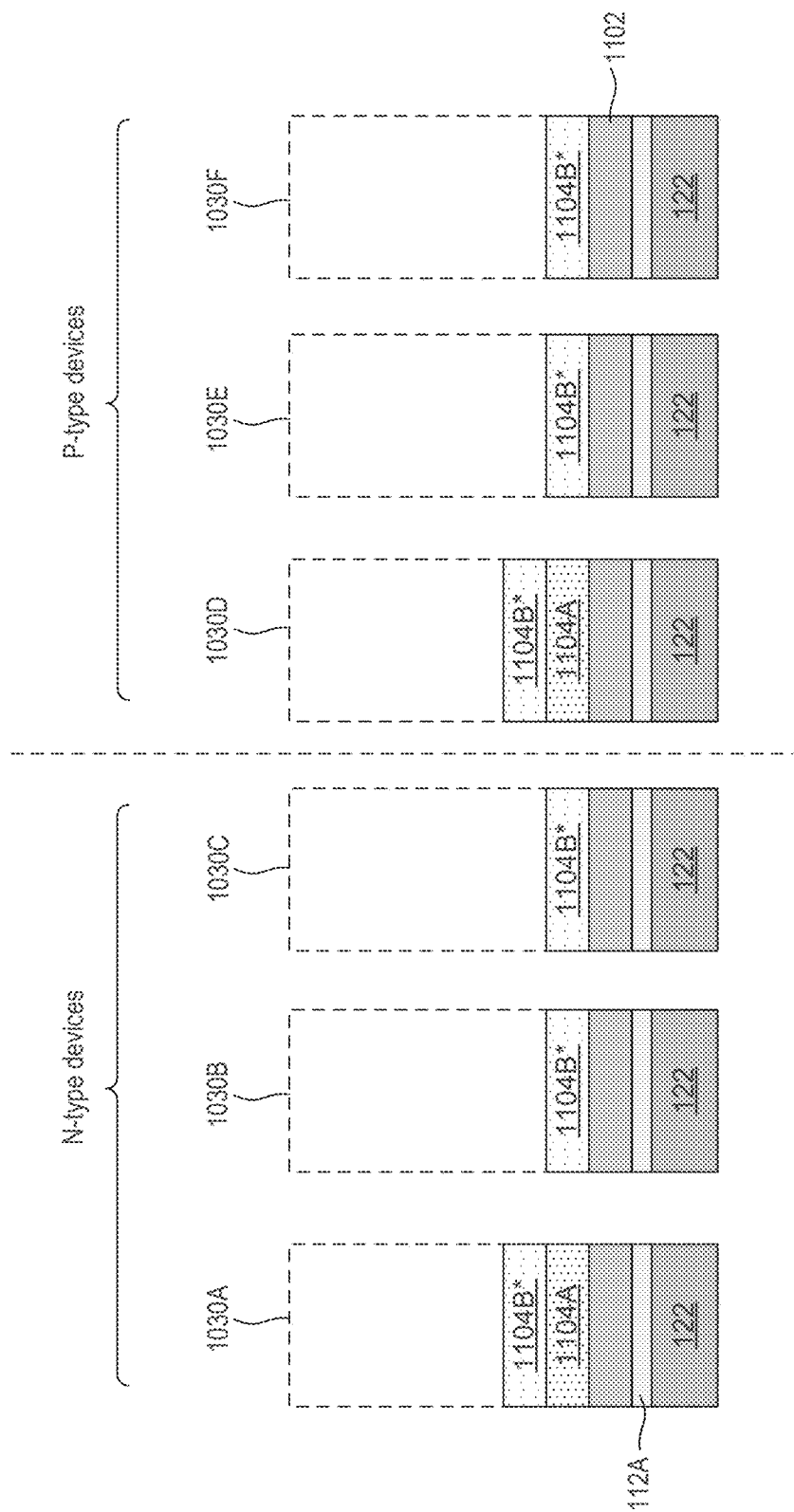

Referring to FIG. 9, at operation 906, a second dopant material is formed in a second selection of n-type and p-type device regions, according to some embodiments. Referring to FIG. 11C, a second dopant material 1104B* is deposited on exposed surfaces of the structure illustrated in FIG. 11B. Second dopant material 1104B* can be different from or similar to first dopant material 1104. For example, both first and second dopant materials 1104 and 1104B* can be formed of lanthanum oxide or magnesium oxide. In some embodiments, first and second dopant materials 1104 and 1104B* can be formed of lanthanum oxide and magnesium oxide, respectively. In some embodiments, the thickness of second dopant material 1104B* can be less than the thickness of first dopant material 1104. For example, second dopant material 1104B* can have a thickness between about 2 Å and about 10 Å. As shown in FIG. 11C, second dopant material 1104B* can be deposited in regions 1030A-1030F. For example, second dopant material 1104B* can be deposited using a substantially conformal deposition method, such as ALD or CVD. In some embodiments, second dopant material 1104B* can be deposited using a similar deposition process as first dopant material 1104 and is not described here for simplicity.

Figure 11D:
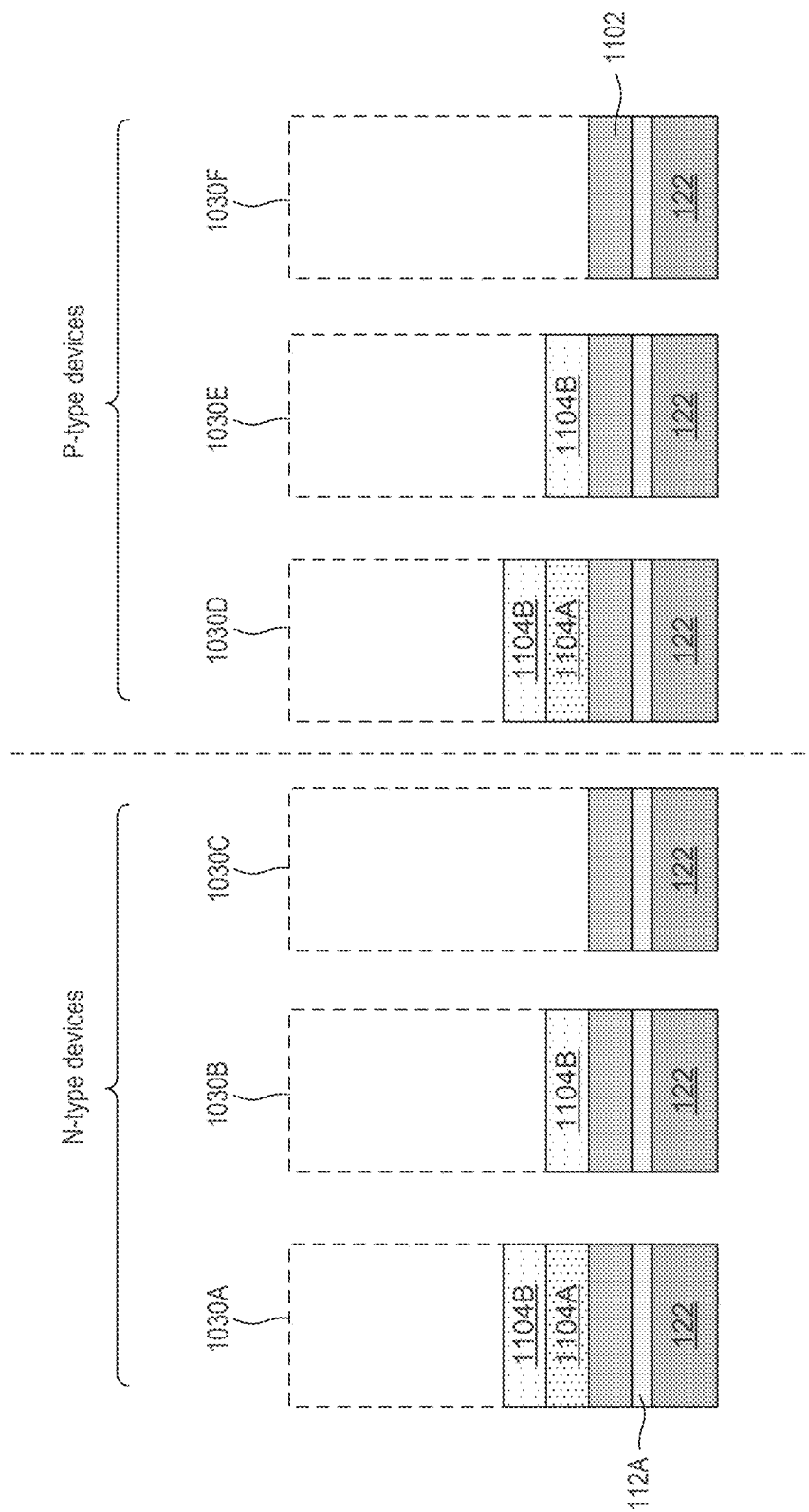

As shown in FIG. 11D, etching processes are performed to remove portions of the deposited second dopant material to form a second dopant layer on exposed surfaces of the semiconductor structure illustrated in FIG. 11C. After the etching process, second dopant layers 1104B are formed in a second selection of n-type and p-type device regions. The patterning and etching of second dopant material 1104B* to form second dopant layers 1104B can be similar to the patterning and etching process of first dopant material 1104 to form first dopant layer 1104A. For example, a blocking layer and a masking element can be patterned to protect underlying second dopant material 1104B* in a second selection of n-type and p-type device regions, such as device regions 1030A-1030B for n-type devices and 1030D-1030E for p-type devices. The remaining second dopant material 1104B* forms second dopant layer 1104B in device regions 1030A, 1030B, 1030D, and 1030E.

Figure 11E:
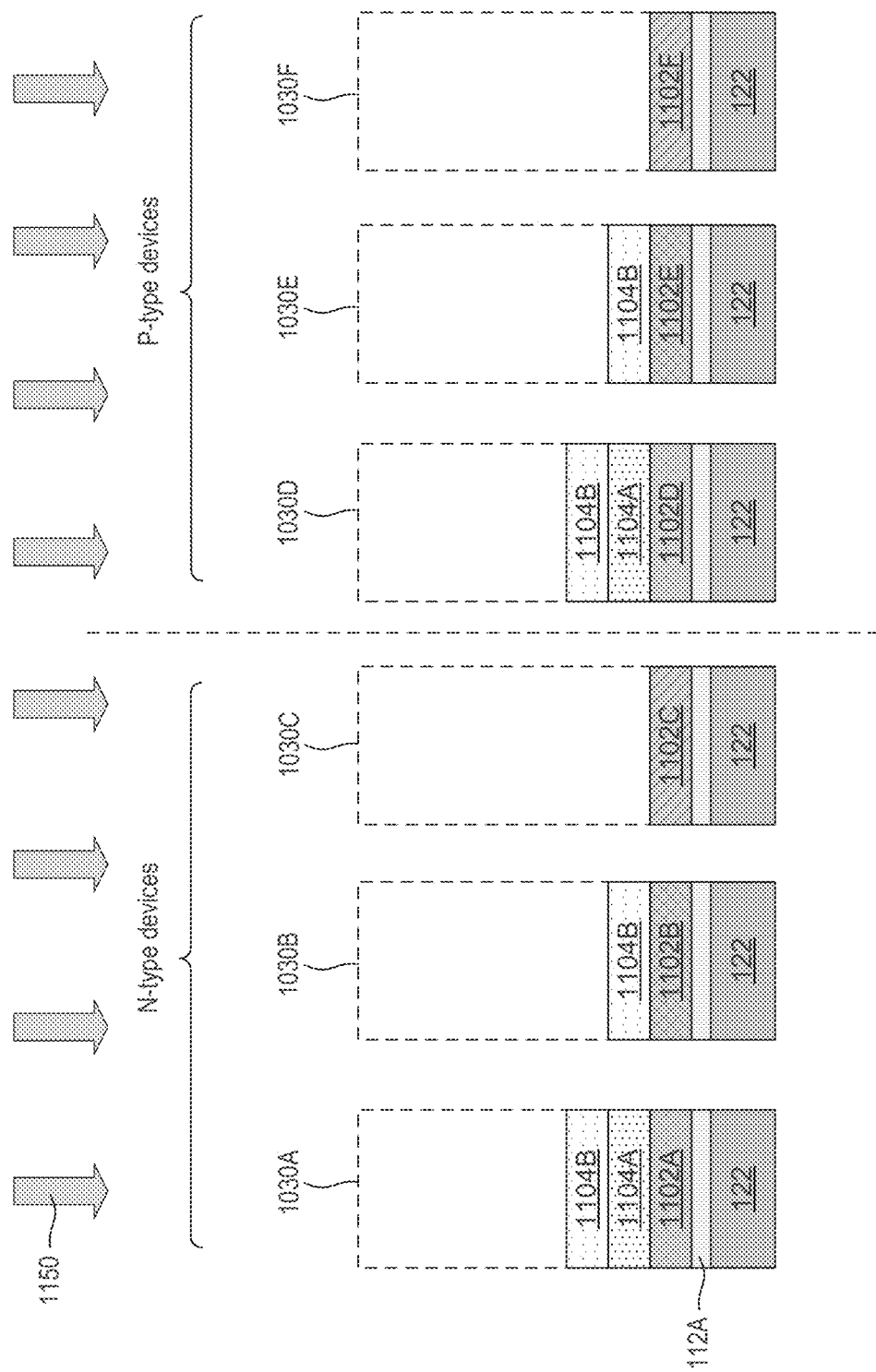

Referring to FIG. 9, at operation 908, an anneal process is performed to drive in dopants from the first and/or second dopant layers into the first gate dielectric layers, according to some embodiments of the present disclosure. Referring to FIG. 11E, an anneal process 1150 is performed to drive in dopants, such as lanthanum from first and/or second dopant layers 1104A and 1104B, into underlying first gate dielectric material 1102. In some embodiments, an underlying gate dielectric can receive greater amounts of dopants which can result in greater dopant concentration if a sufficient supply of dopants is available from the dopant layers above. In some embodiments, a greater number of dopant layers or dopant layers having greater thicknesses can provide more supply of dopants to underlying gate dielectric layers resulting in greater dopant concentration. For example, devices regions, such as 1030A and 1030D, which have both first and second dopant layers 1104A and 1104B can have a greater dopant concentration than devices regions, such as 1030B and 1030E, which have one layer of second dopant layer 1104B. In some embodiments, anneal process 1150 can be a rapid thermal anneal (RTA) process. In some embodiments, anneal process 1150 can be a gradual thermal process, a spike anneal process, flash anneal, any suitable anneal process, and/or combinations thereof. Anneal process 1150 can be a single step anneal process or multi-step anneal process. In some embodiments, anneal process 1150 can be performed at a temperature between about 600° C. and about 800° C. A greater temperature could drive in the dopants in a shorter period of time, but the upper temperature limit can be determined by the thermal budget of the semiconductor devices being annealed. Anneal process 1150 can be performed for suitable amount of time, for example, anneal process can be a spike anneal process performed for a period of time such as a few seconds or less than one second. In some embodiments, the anneal process can be performed between about 0.5 s and about 1 s or between about 1 s and about 5 s. In some embodiments, anneal process 1150 can be performed under a nitrogen-rich environment to prevent oxidation of the layers or contamination. For example, anneal process can be performed in a chamber filled with nitrogen gas.

After anneal process 1150, first gate dielectric layers 1102A-1102F are respectively formed in device regions 1030A-1030F. First gate dielectric layers 1102A and 1102D respectively formed in device regions 1030A and 1030D can have a greater dopant concentration compared to first gate dielectric layers 1102B and 1102E respectively formed in device regions 1030B and 1030E. The greater dopant concentration can be due to more layers of dopant layers formed in device regions 1030A and 1030D compared to device regions 1030B and 1030E. In some embodiments, first gate dielectric layers 1102A, 1102B, 1102D, and 1102E can be formed of a lanthanum doped hafnium oxide material. In some embodiments, first gate dielectric layers 1102A and 1102D can have an atomic dopant ratio of lanthanum over hafnium between about 0.25 and about 0.35. In some embodiments, first gate dielectric layers 1102B and 1102E can have an atomic dopant ratio of lanthanum over hafnium between about 0.10 and about 0.20. In some embodiments, first gate dielectric layers 1102A-1102B and 1102D-1102E can be doped with suitable dopants, such as lanthanum, silicon, yttrium, gadolinium, strontium, any suitable material, and/or combinations thereof. In some embodiments, first gate dielectric layers 1102C and 1102F can be intrinsic (e.g., undoped) material. After anneal process 1150 is performed, first and second dopant layers 1104A and 1104B can be removed using suitable etching process that has a high selectivity of dopant layer over underlying first gate dielectric layers 1102A-1102F. For example, the etching process can be a wet chemical etch process using solutions, such as hydrochloride acid, hydrogen peroxide and any other suitable etchants.

Figure 11F:
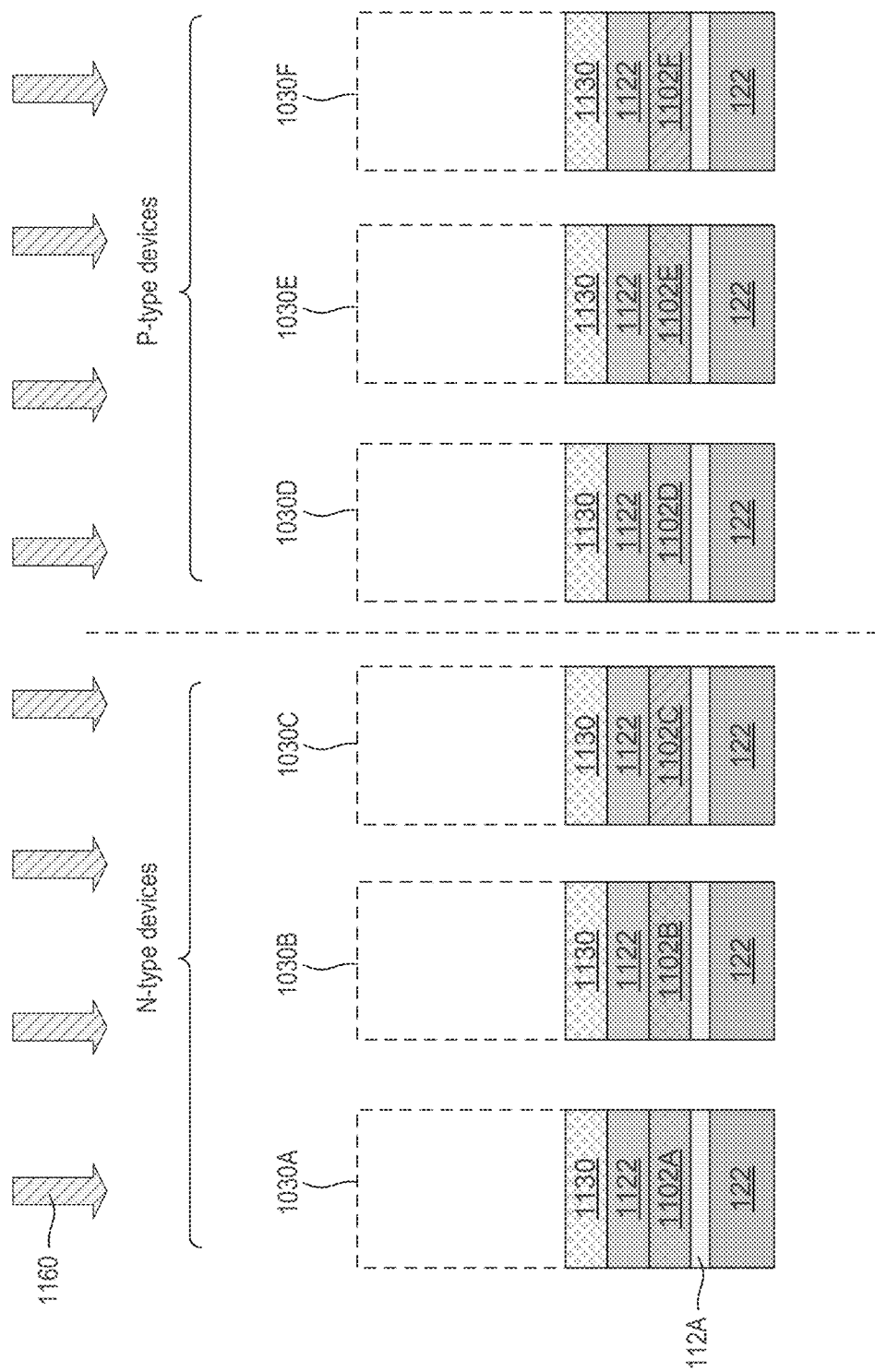
Figure 11G:
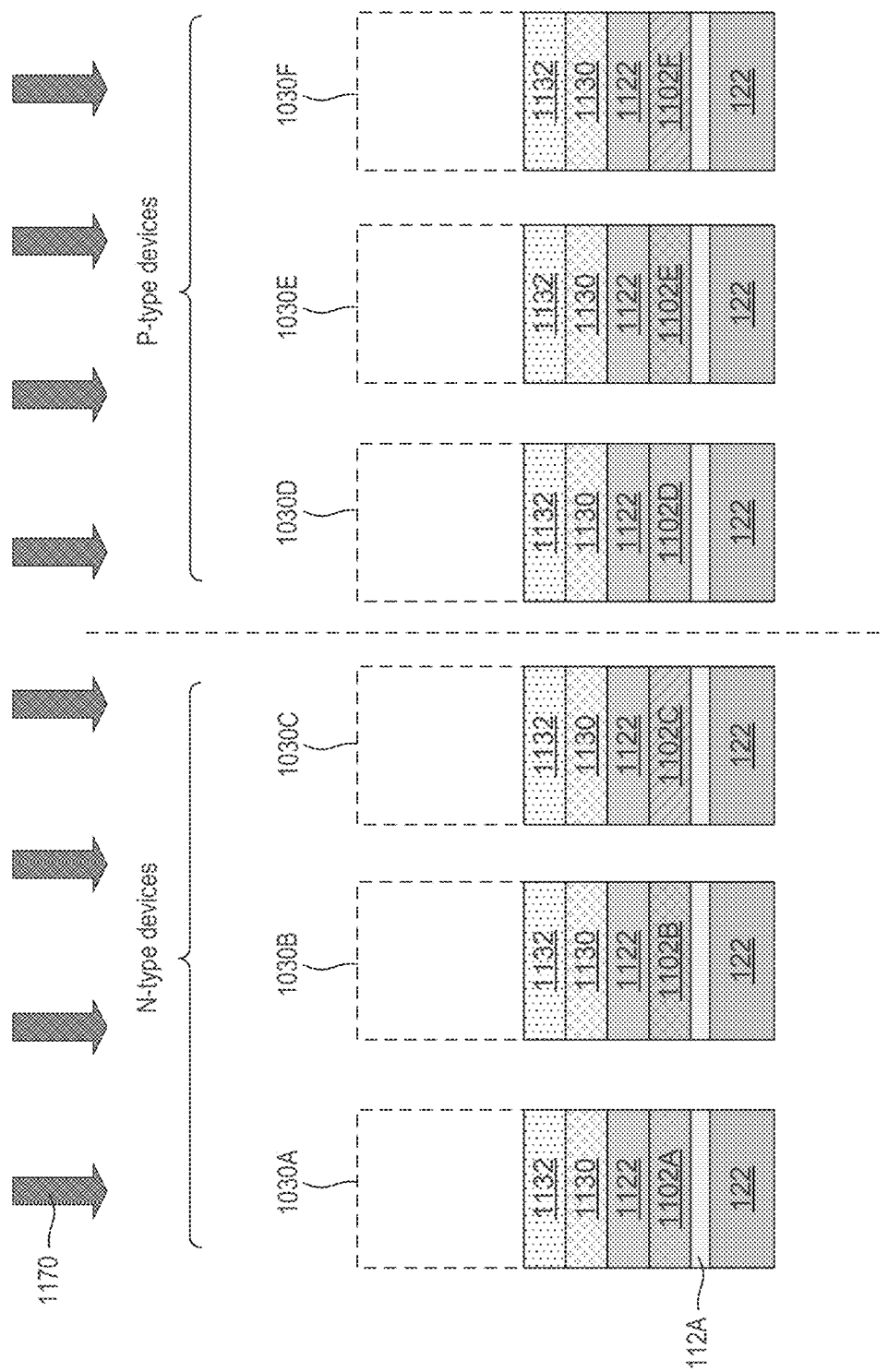

Referring to FIG. 9, at operation 910, a second gate dielectric layer is deposited in the n-type and p-type device regions, and treatment processes are performed on the first and second gate dielectric layers, according to some embodiments of the present disclosure. Referring to FIGS. 11F-11G, a second gate dielectric layer 1122 is deposited in device regions 1030A-1030F. Second gate dielectric layer 1122 can be used to achieve a nominal total thickness of the combined first and second gate dielectric layers. Second gate dielectric layer 1122 can be an intrinsic dielectric layer formed using an intrinsic high-k (e.g., dielectric constant greater than about 3.9) dielectric material. For example, second gate dielectric layer 1122 can be formed using hafnium dioxide. In some embodiments, second gate dielectric layer 1122 can be formed using material similar to first gate dielectric material 1102. In some embodiments, second gate dielectric layer 1122 can have thickness greater than first gate dielectric layers 1102A-1102F. For example, second gate dielectric layer 1122 can have a thickness between about 4 Å and about 10 Å. In some embodiments, second gate dielectric layer 1122 can have a thickness between about 4 Å and about 6 Å, between about 6 Å and about 10 Å, or any other suitable thickness ranges. The total thickness of first and second gate dielectric layers can be between about 14 Å and about 35 Å for device reliability and performance purposes. For example, the total thickness of first and second gate dielectric layers can be between about 14 Å and about 16 Å. Therefore, the thickness of second gate dielectric layer 1122 can be used to supplement the thicknesses of first gate dielectric layers 1102A-1102F such that the total thickness of first and second gate dielectric layers is sufficient for device reliability and performance. In some embodiments, the thickness ratio of the first gate dielectric layer over the second gate dielectric layer can be between about 1.5 and about 3.

First and second capping layer 1130 and 1132 can be deposited on first and second gate dielectric layers 1102A-1102F and 1122. A first treatment process 1160 can be performed between the deposition of first and second capping layers 1130 and 1132. A second treatment process 1170 can be performed on deposited first and second capping layer 1130 and 1132. The first and second treatment processes 1160 and 1170 can be used to improve the quality of first and second gate dielectric layers by improving the crystalline quality through annealing, and first and second capping layers 1130 and 1132 can be used to provide protection for the underlying gate dielectric layers from direct exposure of the treatment processes.

As shown in FIG. 11F, first capping layer 1130 is deposited on second gate dielectric layer 1122 in both n-type and p-type device regions to provide physical protection and to prevent underlying layers, such as gate dielectric layers and interface layers, from oxidation. In some embodiments, first capping layer 1130 can be formed using titanium silicon nitride (TiSiN), titanium nitride, or any suitable material. In some embodiments, first capping layer 1130 can be formed using any suitable dielectric material, including a high-k dielectric material. Treatment process 1160 can be performed on the deposited first capping layer 1130. First treatment process 1160 can be a post metal anneal (PMA) process performed in-situ after the deposition of first capping layer 1130. In some embodiments, first treatment process 1160 can be performed at a temperature between about 850° C. and about 900° C. In some embodiments, first treatment process 1160 can be performed at other suitable temperatures, such as below about 850° C. or above 900° C., depending on device needs and the thermal budget. In some embodiments, first treatment process can be performed in a nitrogen-rich environment, such as in a chamber filled with nitrogen gas.

As shown in FIG. 11G, second capping layer 1132 can be deposited on first capping layer 1130. A second treatment process 1170, such as an anneal process, can be performed. In some embodiments, second capping layer 1132 can be formed using any suitable material, such as silicon. In some embodiments, second treatment process 1170 can be a post cap anneal (PCA) process performed at a greater temperature than first treatment process 1160. In some embodiments, second treatment process 1170 can be performed at a temperature between about 890° C. and about 910° C. In some embodiments, second treatment process 1170 can be used to further improve the quality of underlying gate dielectric layers and interface layers. In some embodiments, second treatment process 1170 can be used to improve the quality of the interface surface between first gate dielectric layers 1102A-1102F and interface layer 112A.

Figure 11H:
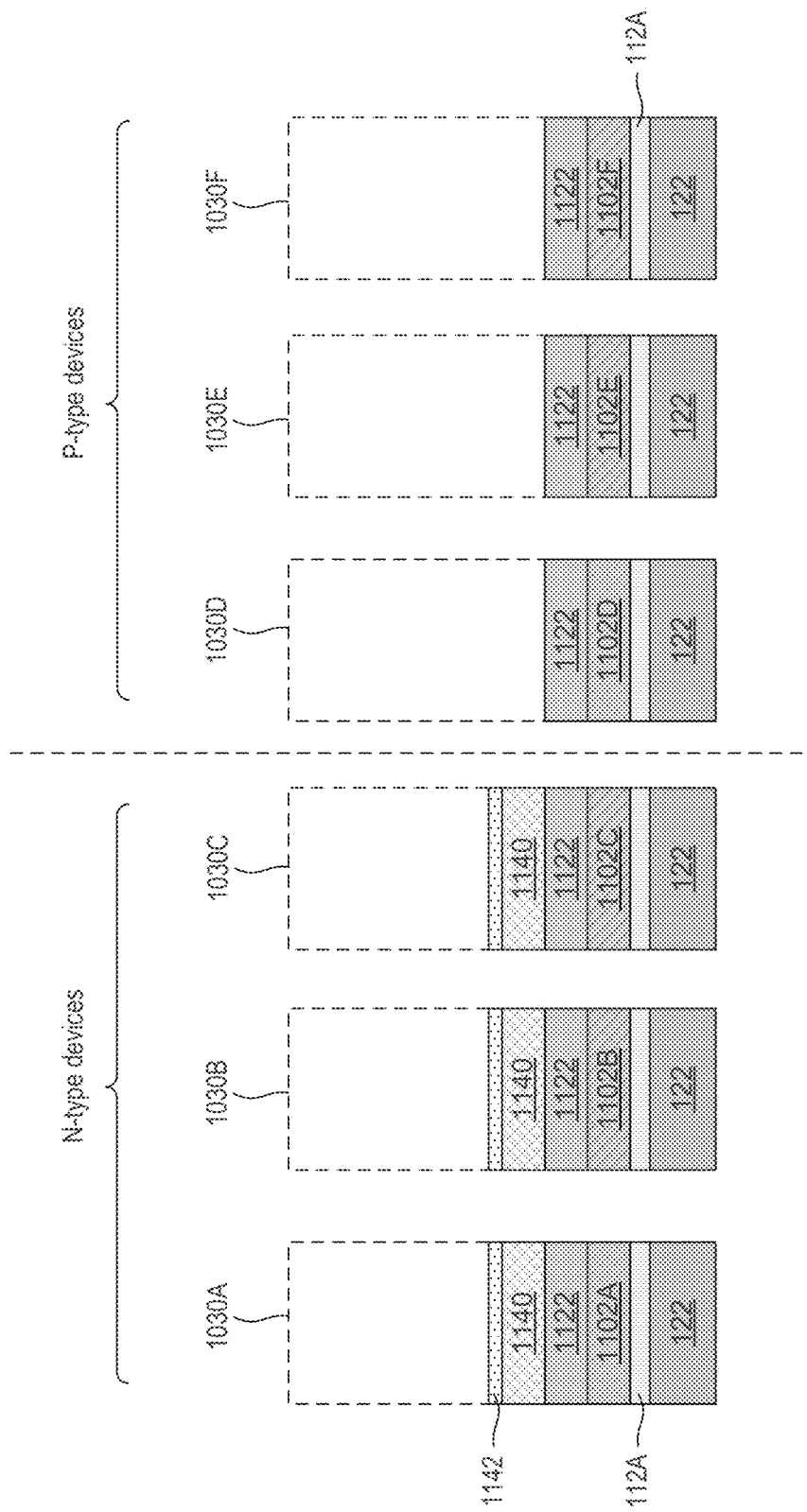

Referring to FIG. 9, at operation 912, a first work function layer and a capping layer are formed in the n-type device regions, according to some embodiments of the present disclosure. Referring to FIG. 11H, first work function layer 1140 and capping layer 1142 are formed in n-type device regions, such as device regions 1030A-1030C. First work function layer 1140 and capping layer 1142 can be formed by blanket depositing a first work function material and a capping material in all exposed device regions, such as device regions 1030A-1030F, followed by a patterning process. The patterning process can include forming blocking layers and masking elements in n-type device region while exposing the first work function material and capping layer in the p-type device region. An etching process can be used to remove the capping layer and first work function material from the p-type device regions. In some embodiments, the etching process can be a wet chemical etching process. For example, the etching process can be an etching process that uses ammonium hydroxide, hydrogen peroxide, any other suitable solutions, and/or combinations thereof. In some embodiments, the etching process can be a dry plasma etching process. The remaining portions of the first work function material and capping material in n-type device regions 1030A-1030C form first work function layer 1140 and capping layer 1142, respectively. In some embodiments, first work function layer 1140 can be formed using an aluminum and/or nitrogen containing material. For example first work function layer 1140 can be formed using titanium aluminum nitride, titanium aluminum carbide nitride, tantalum aluminum nitride, tantalum aluminum carbide nitride, any suitable material, and/or combinations thereof. In some embodiments, first work function layer 1140 can be an n-type work function layer. In some embodiments, first work function layer 1140 can have a thickness between about 10 Å and about 25 Å.

Capping layer 1142 can be formed on first work function layer 1140 by performing a treatment process on first work function layer 1140. In some embodiments, the treatment process can include an in-situ thermal plasma treatment process using titanium chloride and silane as precursors. In some embodiments, the treatment process can be performed at a temperature between about 420° C. and about 480° C. In some embodiments, the treatment temperature can be about 450° C. to prevent oxidation of first work function layer 1142. In some embodiments, silicon capping layer 1142 can have a thickness between about 5 Å and about 10 Å. In some embodiments, capping layer 1142 can be optional.

Figure 11I:
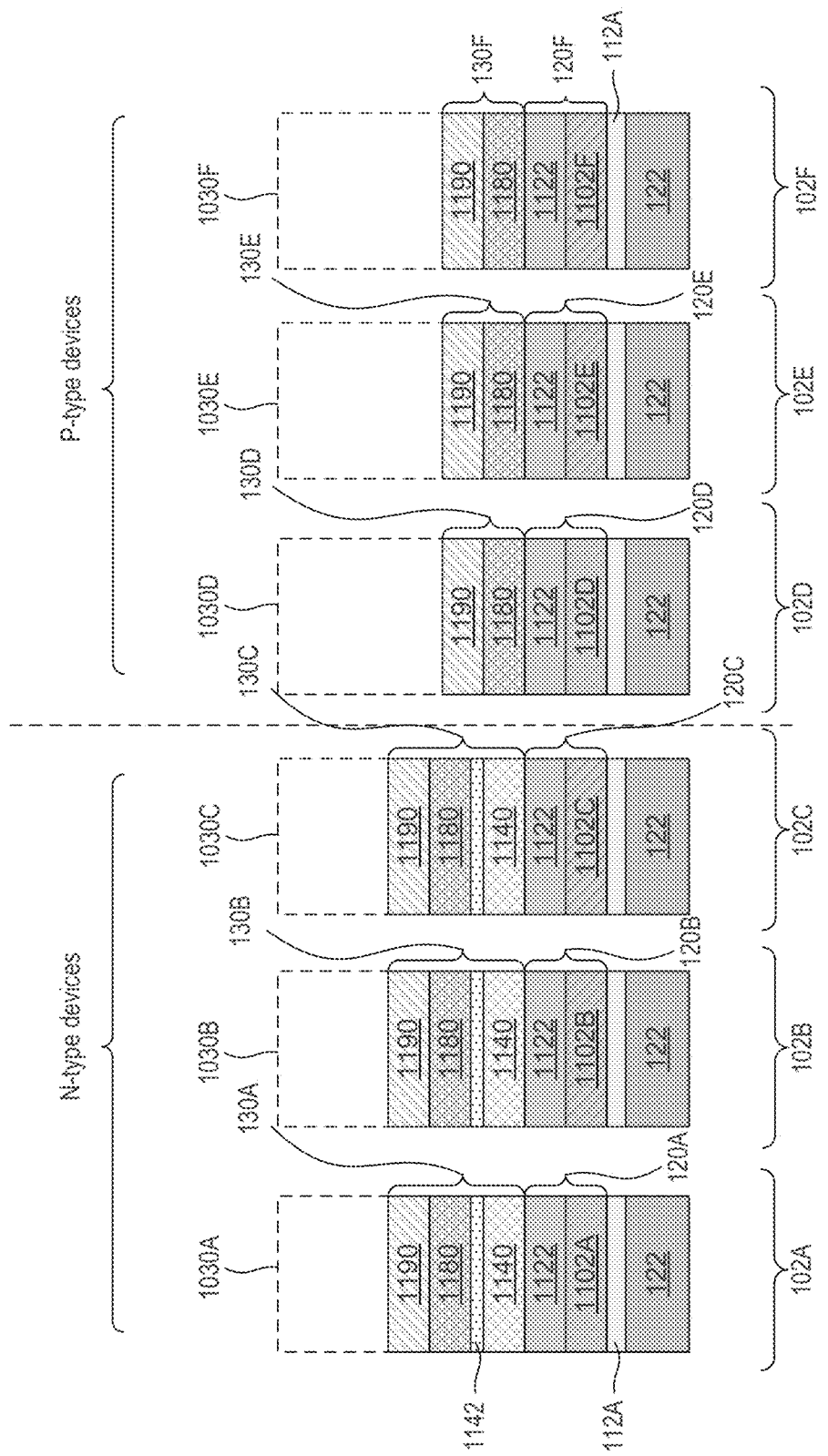

Referring to FIG. 9, at operation 914, a second work function layer and an adhesive layer are formed in the n-type and p-type device regions, according to some embodiments of the present disclosure. Referring to FIG. 11I, second work function layer 1180 can be formed in n-type and p-type device regions 1030A-1030F. Adhesive layer 1190 can be formed on second work function layer 1180. In some embodiments, second work function layer 1180 can be formed using any suitable material. For example, second work function layer 1180 can be a p-type or n-type work function material. In some embodiments, second work function layer 1180 can be formed using any suitable work function material, such as ruthenium oxide. Second work function layer 1180 can be formed using a substantially conformal deposition process, such as ALD or CVD. In some embodiments, second work function layer 1180 can be formed using an ALD process using dimethylbutadiene ruthenium tricarbonyl (Ru(DMBD)(CO)$_3$) and oxygen as precursors. In some embodiments, the deposition process used to form second work function layer 1180 can be performed at any suitable temperature, such as between about 180° C. and about 250° C. In some embodiments, second work function layer 1180 can have a thickness between about 10 Å and about 25 Å. In some embodiments, adhesive layer 1190 can be formed of titanium nitride, titanium, tantalum, tantalum nitride, any suitable adhesive material, and/or combinations thereof. Adhesive layer 1190 can prevent peeling of underlying layers and promote the adhesiveness of subsequently formed gate electrodes. In some embodiments, adhesive layer 1190 can be formed using substantially conformal deposition processes, such as ALD or CVD. In some embodiments, adhesive layer 1190 can also affect finFET threshold voltage and considered as another work function layer. In some embodiments, adhesive layer 1190 can have thickness between about 10 Å and about 25 Å. In some embodiments, adhesive layer 1190 can be optional.

Dopants, such as lanthanum or magnesium, in the doped gate dielectric layers can form electric dipole structures between the doped gate dielectric layers and the first or second gate dielectric layers, which in turn impacts the threshold voltages. The level of dopant concentration can impact threshold voltages. For example, in doped gate dielectric layers formed of lanthanum doped hafnium oxide layers, a greater lanthanum to hafnium ratio can provide a greater change in threshold voltage. In some embodiments, an atomic dopant ratio of lanthanum over hafnium between about 0.10 and about 0.20 can change the threshold voltage between about 70 mV and about 90 mV. In some embodiments, an atomic dopant ratio of lanthanum over hafnium between about 0.25 and about 0.35 can change the threshold voltage between about 140 mV and about 180 mV. As such, exemplary method 900 forms gate dielectric layers 120A-120F and work function layers 130A-130F respectively in regions 1030A-1030F that can provide multi-threshold voltage for finFETs 102A-102F. As shown in FIG. 11I, each device can include a different stack of gate dielectric layer and work function layer that can provide different threshold voltage between the devices. Using n-type device 102A as an example, it can be an ultra-low threshold voltage device that includes gate dielectric layer 120A having first gate dielectric layer 1102A and second gate dielectric layer 1122. First gate dielectric layer 1102A can be doped with suitable dopants, such as lanthanum or magnesium. N-type device 102A can further include a work function layer stack 130A that includes first work function layer 1140, capping layer 1142, second work function layer 1180, and adhesive layer 1190. Similarly, n-type device 102B can be a low threshold voltage device having gate dielectric layer 120B and work function layer stack 130B where the former includes a first gate dielectric 1102B that has a lower dopant concentration than first gate dielectric 1102A of n-type device 102A. Variations of dopant concentrations, such as lanthanum or magnesium concentrations in gate dielectric layers 1102A and 1102B, can lead to changes in the crystallographic structure of the hafnium-based gate dielectric layers and form electric dipoles at the interfaces between the gate dielectric layers and work function layers, which can impact spontaneous polarization and internal bias fields and result in variations of device threshold voltage.

Figure 11J:
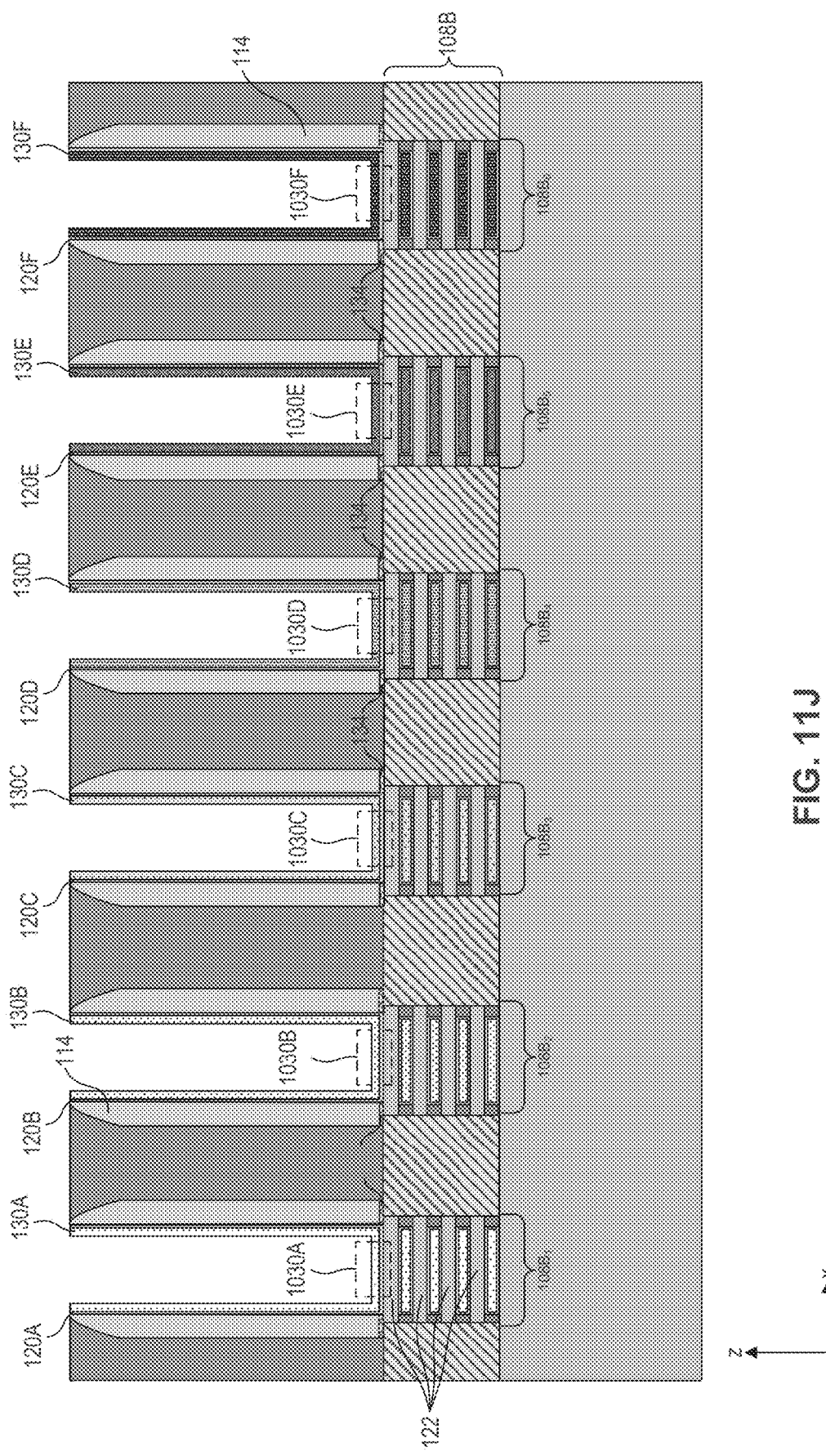

FIG. 11J illustrates gate dielectric layers 120A-120F and work function layers 130A-130F formed between spacers 114 and between each layer of the stack of semiconductor layers 122. Gate dielectric layers 120A-120F and work function layers 130A-130F can each wrap around nanowire-shaped semiconductor layers 122 formed as a result of the removal of first semiconductor layers 320. Depending on the spaces available between adjacent semiconductor layers 122, semiconductor layers 122 can be wrapped around by gate dielectric layers 120A-120F and work function layers 130A-130F, filling the spaces between adjacent semiconductor layers 122.

Figure 12A:
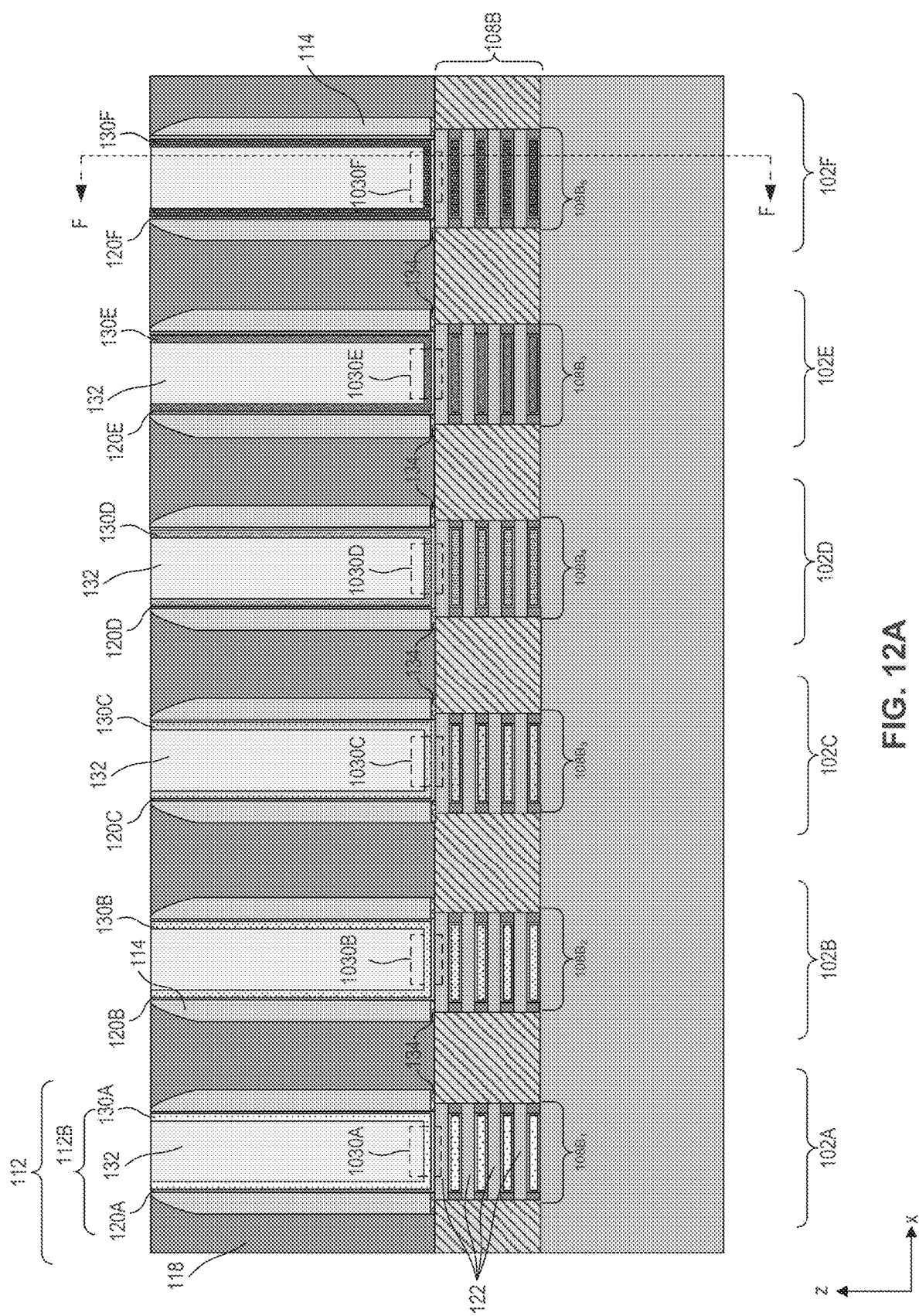
FIGS. 12A-12B are various views of semiconductor devices having multi-threshold voltage devices, in accordance with some embodiments.
Figure 12B:
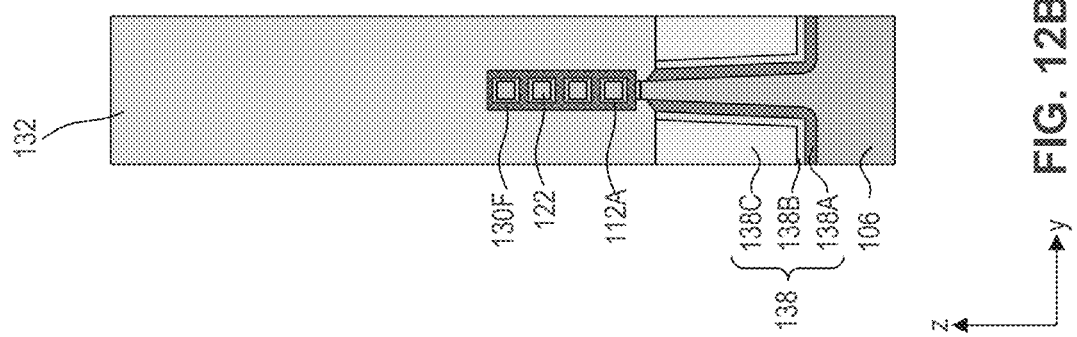

Referring to FIG. 2, in operation 240, gate electrodes are formed on the work function layers, according to some embodiments. Referring to FIG. 12A-12B, layers of conductive material for gate metal fill layers 132 are formed on work function layers 130A-130F. The layer of conductive material for gate metal fill layers 132 can include suitable conductive materials, such as titanium, silver, aluminum, tungsten, copper, ruthenium, molybdenum, tungsten nitride, cobalt, nickel, titanium carbide, titanium aluminum carbide, manganese, zirconium, metal alloys, and/or combinations thereof. Gate metal fill layers 132 can be formed by ALD, PVD, CVD, or other suitable deposition processes. The deposition of gate metal fill layers 132 can continue until openings between opposing spacers are filled with gate metal fill layers 132. A chemical mechanical polishing process can remove excessive gate metal fill layers 132 such that top surfaces of gate metal fill layers 132 and ILD 118 are substantially coplanar. In some embodiments, other structures can be formed, such as blocking layers, gate contact structures, and S/D contact structures. One or more blocking layers can be formed prior to depositing gate metal fill layers 132 to prevent diffusion and oxidation of gate metal fill layers 132. Gate and S/D contact structures can be formed by forming openings in gate metal fill layers 132 and ILD 118. Gate contact and S/D contact structures can be formed and respectively connected to gate metal fill layers 132 and epitaxial fin region 110. Forming the contact structures can include a deposition of contact metal followed by CMP of the deposited contact metal. The formation of contact metal can include deposition of a metal layer within the openings and silicidation of the deposited metal layer. The conductive materials for the metal layer and/or the contact metal can include titanium, aluminum, silver, tungsten, cobalt, copper, ruthenium, zirconium, nickel, titanium nitride, tungsten nitride, metal alloys, and/or combinations thereof and can be formed by ALD, PVD, CVD, or other suitable deposition processes.

Various embodiments in the present disclosure describe methods for forming multi-threshold voltage devices through multi-deposition and patterning process to form doped gate dielectric layers and multi-layer metal work function materials as work function layers in different device regions. Devices with different compositions of doped gate dielectric layers and work function layers can be formed on a substrate, thus forming semiconductor devices with multi-threshold voltages. The doped gate dielectric layers can be hafnium-based high-k (e.g., dielectric constant greater than about 3.9) dielectric layers doped with a suitable material, such as lanthanum. Variations of the dopant concentrations can lead to changes in the crystallographic structure of the hafnium-based gate dielectric layers and form electric dipoles at the interfaces between the gate dielectric layers and work function layers, which can result in variations in device threshold voltage. The gate dielectric layers can be doped by depositing an intrinsic gate dielectric layer and depositing one or more dopant-containing films on the intrinsic gate dielectric layer. In some embodiments, an anneal process can be used to drive in the dopant from the dopant-containing films into the intrinsic gate dielectric layer.

In some embodiments, a semiconductor device includes a first transistor having a first gate structure, wherein the first gate structure includes a first gate dielectric layer doped with a first dopant at a first dopant concentration and a first work function layer on the first gate dielectric layer. The first gate structure also includes a first gate electrode on the first work function layer. The semiconductor device also includes a second transistor having a second gate structure, where the second gate structure includes a second gate dielectric layer doped with a second dopant at a second dopant concentration lower than the first dopant concentration. The second gate structure also includes a second work function layer on the second gate dielectric layer and a second gate electrode on the second work function layer.

In some embodiments, a semiconductor device includes a first gate-all-around field effect transistor (GAA FET), including a first plurality of nanowires and a first doped gate dielectric layer around the first plurality of nanowires. The first GAA FET has a first work function layer around the first gate dielectric layer and a first gate electrode on the first work function layer. The semiconductor device also includes a second GAA FET including a second plurality of nanowires and a second doped gate dielectric layer on the second plurality of nanowires. The first doped gate dielectric layer comprises a first dopant concentration that is greater than a second dopant concentration of the second doped gate dielectric layer. A second work function layer is formed on the gate dielectric layer and a second gate electrode is on the second work function layer.

In some embodiments, A method includes depositing a first gate dielectric material on a plurality of nanowires. The plurality of nanowires are formed in first and second device regions. The method includes forming a first dopant layer on the first gate dielectric material in the first device region and forming a second dopant layer on the first dopant layer in the first device region and on the first gate dielectric material in the second device region. The method includes performing an anneal process on the first gate dielectric material and on the first and second dopant layers. The method also includes removing the first and second dopant layers and depositing a second gate dielectric material on the first gate dielectric material. The method also includes forming a first work function layer on the second gate dielectric material and forming a second work function layer on the first work function layer. The method further includes forming gate electrodes on the second work function layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing a first gate dielectric material on a plurality of nanowires, the plurality of nanowires formed in first and second device regions;
forming a first dopant layer on the first gate dielectric material in the first device region;
forming a second dopant layer on the first dopant layer in the first device region and on the first gate dielectric material in the second device region;
performing an anneal process on the first gate dielectric material and on the first and second dopant layers;
removing the first and second dopant layers;
depositing a second gate dielectric material on the first gate dielectric material;
forming a first work function layer on the second gate dielectric material;
forming a second work function layer on the first work function layer; and
forming gate electrodes on the second work function layer.

2. The method of claim 1, wherein depositing the first and second gate dielectric materials comprises depositing hafnium oxide.

3. The method of claim 1, wherein forming the first and second dopant layers comprises depositing lanthanum oxide.

4. The method of claim 1, wherein performing the anneal process comprises rapid thermal annealing (RTA) the first gate dielectric material and the first and second dopant layers at a temperature between about 600° C. and about 800° C.

5. The method of claim 1, further comprising performing a plasma treatment process on the first work function layer with titanium chloride and silane as precursors.

6. A method, comprising:
depositing a gate dielectric layer on first and second pluralities of semiconductor layers;
depositing a first dopant layer around each semiconductor layer of the first and second pluralities of semiconductor layers;
removing portions of the first dopant layer deposited around the second plurality of semiconductor layers;
depositing a second dopant layer on remaining portions of the first dopant layer and around each semiconductor layer of the second plurality of semiconductor layers; and
performing an anneal process on the gate dielectric layer, the remaining portions of the first dopant layer, and the second dopant layer.

7. The method of claim 6, further comprising:
removing the remaining portions of the first dopant layer; and
removing the second dopant layer.

8. The method of claim 7, further comprising depositing first and second work function layers over the first and second pluralities of semiconductor layers, respectively.

9. The method of claim 8, wherein depositing the first and second work function layers comprises depositing n-type and p-type materials, respectively.

10. The method of claim 8, wherein depositing the first and second work function layers comprises depositing p-type and n-type materials, respectively.

11. The method of claim 8, further comprising performing a plasma treatment process on the first work function layer using titanium chloride and silane as precursors.

12. The method of claim 6, wherein depositing the gate dielectric layer comprises depositing hafnium oxide.

13. The method of claim 6, wherein depositing the first and second dopant layers comprises depositing lanthanum oxide.

14. The method of claim 6, wherein performing the anneal process comprises performing a rapid thermal annealing (RTA) process at a temperature between about 600° C. and about 800° C.

15. The method of claim 6, further comprising depositing an other gate dielectric layer on the gate dielectric layer.

16. A method, comprising:
forming a first gate dielectric layer with a first atomic dopant ratio, comprising:
depositing an intrinsic gate dielectric material;
depositing first and second dopant layers on a first portion of the intrinsic gate dielectric material; and
performing an anneal process on the first portion of the intrinsic gate dielectric material and the first and second dopant layers; and
forming a second gate dielectric layer having a second atomic dopant ratio lower than the first atomic dopant ratio, comprising:
depositing the second dopant layer on a second portion of the intrinsic gate dielectric material; and
performing the anneal process on the second portion of the intrinsic gate dielectric material and the second dopant layer.

17. The method of claim 16, wherein depositing the intrinsic gate dielectric material comprises depositing hafnium oxide.

18. The method of claim 16, wherein depositing the first and second dopant layers comprises depositing lanthanum oxide.

19. The method of claim 16, wherein performing the anneal process comprises performing a rapid thermal annealing (RTA) process at a temperature between about 600° C. and about 800° C.

20. The method of claim 16, further comprising removing the first and second dopant layers after performing the anneal process.

* * * * *